United States Patent [19]

Tsubata et al.

[11] Patent Number: 5,530,664
[45] Date of Patent: Jun. 25, 1996

[54] METHOD AND APPARATUS FOR AUTOMATICALLY DESIGNING LOGIC CIRCUIT, AND MULTIPLIER

[75] Inventors: Shintaro Tsubata; Tamotsu Nishiyama, both of Osaka, Japan

[73] Assignee: Matsushita Electric Industrial Co., Ltd., Osaka, Japan

[21] Appl. No.: 174,450

[22] Filed: Dec. 28, 1993

[30] Foreign Application Priority Data

Dec. 28, 1992 [JP] Japan ................................. 4-348269

[51] Int. Cl.$^6$ .............................. G06F 7/52; G06F 15/00
[52] U.S. Cl. ............................................ 364/757; 364/488
[58] Field of Search .............................. 364/754–760, 364/488–491

[56] References Cited

U.S. PATENT DOCUMENTS

| | | | |
|---|---|---|---|
| 4,896,272 | 1/1990 | Kurosawa | 364/490 X |
| 4,964,056 | 10/1990 | Bekki et al. | 364/488 |
| 5,043,914 | 8/1991 | Nishiyama et al. | 364/513 |
| 5,333,032 | 7/1994 | Matsumoto et al. | 364/489 |
| 5,345,393 | 9/1994 | Ueda | 364/489 |
| 5,351,206 | 9/1994 | Yang et al. | 364/757 |

FOREIGN PATENT DOCUMENTS

| | | |
|---|---|---|
| 0437876 | 7/1991 | European Pat. Off. . |
| 2650088 | 1/1991 | France . |
| 51-64844 | 4/1976 | Japan . |
| 3-15984 | 1/1991 | Japan . |
| 3-17737 | 1/1991 | Japan . |

OTHER PUBLICATIONS

*Nikkei Electronics*, pp. 76–89, May 29, 1978.
Arts, et al., "Flexible Block—Multiplier Generation", Nov. 11, 1991, IEEE International Conference on Computer-Aided Design, Santa Clara, CA, pp. 106–109.

Primary Examiner—Roy N. Envall, Jr.
Assistant Examiner—Chuong D. Ngo
Attorney, Agent, or Firm—Willian Brinks Hofer Gilson & Lione

[57] ABSTRACT

In the case where a multiplier factor is a constant, if the number of the bits having the value of 1 in the multiplier factor is 3 or more and if it is larger than the number of the bits having the value of 0, a circuit for performing multiplication by using the logic NOT number of the multiplier factor, which is obtained by inverting all the bits in the multiplier factor by the logic NOT operation is generated. If the number of the bits having the value of 1 in the multiplier factor is 3 or more and if it is smaller than the number of the bits having the value of 0, the multiplier factor is divided so that an adder for adding partial products forms a well-balanced binary tree. Conversely, if the number of the bits having the value of 1 in the multiplier factor is 2 or less, an add shift multiplier for calculating partial products only with respect to the bits having the value of 1 is generated.

10 Claims, 28 Drawing Sheets

```
wire     sig1,sig2,...,sig7;
assign   sig3=sig6 & sig7;
assign   {sig4,sig5}=sig1+sig2+sig3;
```

| 31 IDENTIFICATION NAME | 32 ATTRIBUTE CODE | 33 ATTRIBUTE VALUE |
|---|---|---|
| (gate01 ::: | a_kind_of :: | adder ; |
|  | input :: | [ sig1,sig2,sig3 ]; |
|  | output :: | [ sig4,sig5 ]) |
| (gate02 ::: | a_kind_of :: | and ; |
|  | input :: | [ sig6,sig7 ]; |
|  | output :: | sig3) |

```
wire  [7:0]   a;
wire  [15:0]  b;
assign b=a*8'h82;
```

```
(gate1  :::  a_kind_of    ::  multiplier;
             input(i1)    ::  [a(7:0)];
             input(i2)    ::  [130];
             bitwidth(i1) ::  8 ;
             bitwidth(i2) ::  8 ;
             output(o)    ::  b(15:0)).
```

(STEP 1002)

(STEP 1008)

(STEP 1010)

Fig.10 (a)
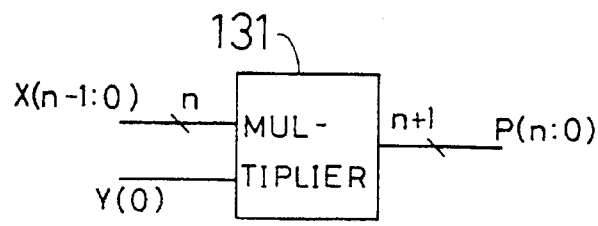
Fig.10 (b)
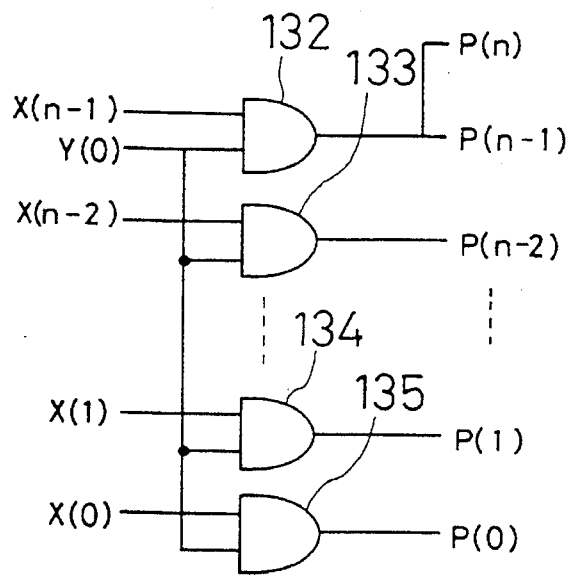
Fig.10 (c)
```
(gate    :::  a_kind_of  ::  multiplier;
              input(i1)  ::  X(n-1:0);
              input(i2)  ::  Y(0);
              output     ::  P(n:0))
-->
(gate1   :::  a_kind_of  ::  and;
              input(i1)  ::  X(0);
              input(i2)  ::  Y(0);
              output     ::  P(0)),
                  .
                  .
                  .
(gate n  :::  a_kind_of  ::  and;
              input(i1)  ::  X(n-1);
              input(i2)  ::  Y(0);
              output     ::  P(n-1)),
(gate n+1::: a_kind_of   ::  netcon;
              input(i)   ::  P(n-1);
              output     ::  P(n)).
```

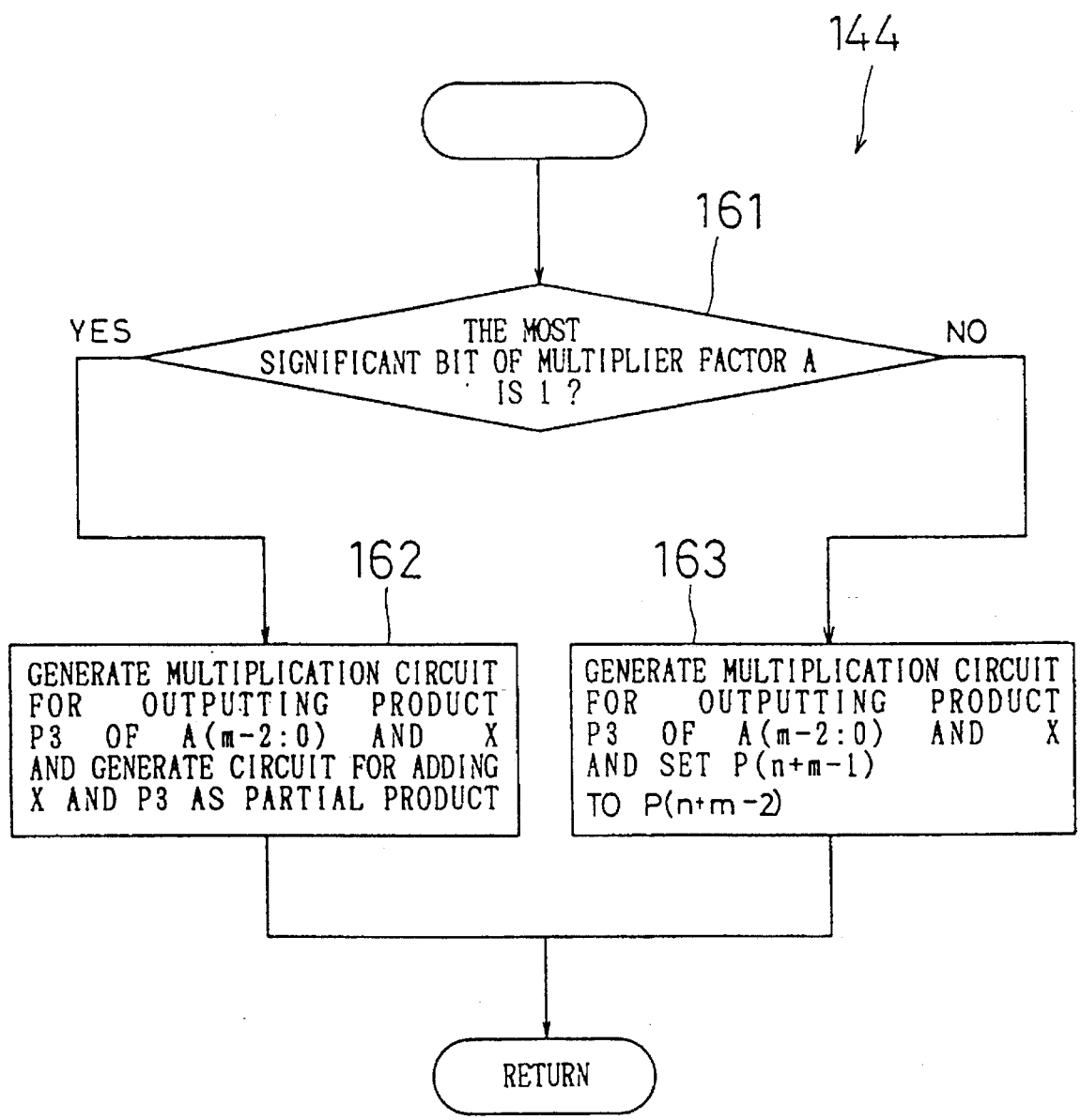

Fig.17

```
(Gate     :::   a_kind_of      ::  multiplier;
                input(i1)      ::  A(m-1:0);
                input(i2)      ::  X(n-1:0);
                output         ::  P)
:=>
(Gate1    :::   a_kind_of      ::  multiplier;
                input(i1)      ::  A(m-2:0);
                input(i2)      ::  X(n-1:0);
                output         ::  P3(n+m-2:0)).
(Gate2    :::   a_kind_of      ::  ripper;
                input          ::  P3(n+m-2:0);
                output(o1)     ::  P(m-2:0);
                output(o2)     ::  P3(n+m-2:m-1));
(Gate3    :::   a_kind_of      ::  adder;
                input(i1)      ::  P3(n+m-2:m-1);
                input(i2)      ::  X(n-1:0);
                output         ::  P(n+m-1:m-1)).
```

METHOD AND APPARATUS FOR AUTOMATICALLY DESIGNING LOGIC CIRCUIT, AND MULTIPLIER

BACKGROUND OF THE INVENTION

The present invention relates to a method and apparatus for automatically designing a logic circuit, particularly a multiplier or a logic circuit including a multiplier, and to a multiplier.

Conventional multipliers for performing multiplication with digital information are often used not only as single, independent LSIs but also as elements to be mounted in such LSIs as DSP (digital signal processor). However, as the bit width is increased in multiplication and their applications are more diversified, multipliers of this type are required to have reduced circuit size and chip area as well as to operate at higher speed. To meet the requirements, circuit systems using various multiplication methods have been proposed.

For example, a multiplication method using the Booth's 2-bit recode system, which is one of the highest-speed multiplication methods, is disclosed in "Nikkei Electronics" (May 29, pp. 76–89 (1978)). The multiplication method uses the following algorithm in order to increase the speed of multiplication.

If an n-bit multiplicand X is to be multiplied by an m-bit multiplier factor Y, e.g., the multiplier factor Y is represented by two's complements as follows:

$$Y = -ys * 2^{m-1} + \sum_{i=1}^{m-1} (y_i * 2^{i-1})$$
$$= \sum_{i=0}^{q-1} \{(y_{2i} + y_{2i+1} - 2y_{2i+2}) * 2^{2i}\},$$

where ym=ys, q=m/2 if m is an even number or q=(m−1)/2 if m is an odd number, and y0=0 (y is a value given for convenience).

Hence, the product P of X and Y becomes $$P = X * Y$$
$$= \sum_{i=0}^{q-1} \{(y_{2i} + y_{2i+1} - 2y_{2i+2}) * X * 2^{2i}\}.$$

Here, since the values of $Y_{2i}$, $Y_{2i+1}$, and $Y_{2i+2}$ are 0 or 1, $(y_{2i}+y_{2i+1}-2y_{2i+2})$ becomes 0, ±1, or ±2, so that each of their partial products becomes a value obtained by multiplying 0, ±X, or ±2X by $2^{2i}$.

TABLE 1

| $y_{2i+2}$ | $y_{2i+1}$ | $y_{2i}$ | $(y_{2i} + y_{2i+1} - 2y_{2i+2})$ |
|---|---|---|---|
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

Here, a circuit for generating the partial products can be composed of a shifter primarily for shifting the multiplicand ±X by one bit till it is doubled and a shifter for shifting a mantissa (0, ±X or ±2X) by two bits till it is raised to the power of $2^{2i}$ (weighing).

As for the number of logic stages in a circuit for calculating the total sum of the partial products, since the number of the partial products becomes q=m/2 (m is an even number) or q=(m−1)/2 (m is an odd number), it becomes approximately $\log_2 m-1$ (m is an even number) or $\log_2(m-1)-1$ (m is an odd number) when a 2-input adder is connected so as to form a binary tree.

As an example of high-speed multipliers not using the Booth's 2-bit recode system, Japanese Patent Publication no. 03-017737 discloses a multiplier using redundant binary code.

With the multiplier mentioned above, when the multiplier factor is composed of 24 bits, the number of its partial products becomes 12 and the number of its logic stages becomes 4.

On the other hand, the increase in multiplication speed and the decrease in circuit size have been pursued not only by improving the performance of such a multiplication algorithm as mentioned above, but also by optimizing the circuit on the level of logic elements.

In recent years, multipliers and logic circuits containing multipliers are mostly designed by using automatic designing systems. Such a system is intended to eliminate a redundant portion of the circuit or to perform other operations by replacing a part of the circuit with an equivalent circuit having a smaller number of logic elements and logic stages in the case of, e.g., expanding circuit information on the level of logic elements to circuit information on the level of mounted elements, which are actually mounted in a chip.

If functional description information, which represents a function requested on the circuit in a hardware description language or the like, is inputted to such an automatic designing system, the system converts it to functional circuit information in an internal representation form, which represents a circuit composed of virtual functional elements whose functions are primarily and solely defined. Then, the resulting functional circuit information is further converted to logic circuit information which represents a circuit composed of real logic circuits, followed by the generation of mounted circuit information which represents a circuit to which real elements, mounted by specified technology, are allotted.

With the conventional automatic designing systems, however, the optimization of the circuit on the level of logic elements is localized, for the replacement by an equivalent circuit having a smaller number of logic elements and logic stages is limited to portions of the circuit that coincide with specific patterns which were preliminarily set. If such optimization is performed in the case where the multiplier factor or multiplicand is a constant, a circuit having the minimum number of logic elements and the like cannot necessarily be obtained. In particular, when a two-input adder for adding partial products is connected so as to form a binary tree, the balance between two branches is normally destroyed if the portion associated with the add circuit for the partial products, in which the values of all the bits are 0, is omitted. Therefore, it is difficult to minimize the number of logic elements and the number of logic stages by partially replacing the circuit.

SUMMARY OF THE INVENTION

In view of the foregoing, an object of the present invention, in the case of generating a multiplier for performing multiplication by using a constant as its multiplier factor or multiplicand or a logic circuit including such a multiplier, is to provide a method and apparatus for automatically designing a logic circuit having a smaller number of logic elements and logic stages and to provide a high-speed multiplier for performing multiplication by using a constant as is multiplier factor or multiplicand, which has a smaller number of logic elements and logic stages appropriately for large-scale integration.

To attain the above object, a method of automatically designing a logic circuit for generating information on the logic circuit for calculating the product of a multiplier factor, which is a constant, and a multiplicand, comprises the steps of: (a) inputting the value of said multiplier factor; (b) detecting a bit having the value of 1 in said multiplier factor; (c) generating information on a partial product calculating circuit for calculating the partial products of said multiplier factor and multiplicand only with respect to the bits having the value of 1 in said multiplier factor, depending on the result of detection obtained in said step (b); and (d) generating information on a partial product sum calculating circuit for calculating the sum of the partial products calculated by said partial product calculating circuit.

To attain the above object, an apparatus for automatically designing a logic circuit for generating information on the logic circuit for calculating the product of a multiplier factor, which is a constant, and a multiplicand, comprises: an input means for inputting the value of said multiplier factor; a detecting means for detecting the bits having the value of 1 in said multiplier factor; a first circuit information generating means for generating information on a partial product calculating circuit for calculating the partial products of said multiplier factor and multiplicand only with respect to the bits having the value of 1 in said multiplier factor, depending on the result of detection by said detecting means; and a second circuit information generating means for generating information on a partial product sum calculating means for calculating the sum of the partial products calculated by said partial product calculating circuit.

With the above structure, information on a partial product calculating circuit, which calculates the partial products of the bits having the value of 1 in the multiplier factor and the multiplicand, and on a partial product sum calculating circuit, which calculates the sum of the partial products, is generated. Consequently, it becomes possible to easily reduce circuit size and increase multiplication speed.

Preferably, the above method of automatically generating a logic circuit further comprises the step of (e) dividing the bits having the value of 1 into groups so that each group contains about the same number of bits having the value of 1 if the number of the bits having the value of 1 is 4 or more, wherein information on the partial product sum calculating circuit for adding the partial products which correspond to the individual groups is generated in said step (d).

The above apparatus for automatically calculating a logic circuit further comprises: a bit number detecting means for detecting the number of the bits having the value of 1 in said multiplier factor; and a grouping means for dividing the bits having the value of 1 into groups so that each group contains about the same number of bits having the value of 1 if the number of said bits detected by said bit number detecting means is 4 or more, wherein said second circuit information generating means generates information on the partial product sum calculating circuit for adding the partial products which correspond to the individual groups.

Thus, even when the bits having the value of 1 are unevenly distributed, the multiplier factor is divided into groups so that each group has substantially the same number of the bits having the value of 1, thereby generating information on the partial product sum calculating circuit for calculating the sum of partial products. Consequently, the partial product sum calculating circuit is structured in well-balanced binary tree, which readily realizes higherspeed multiplication and reduces the number of logic stages in the circuit.

The above step (e), or grouping by the grouping means, may be performed in the case where the number of the bits having the value of 1 is 2 or 3.

Preferably, the above method of automatically designing a logic circuit further comprises the step of (f) generating information on a logic NOT generating circuit for providing the logic NOT number of said multiplier factor, which is obtained by inverting all the bits in said multiplier factor, if the number of the bits having the value of 1 in said multiplier factor is about ½ or more of the number of all the bits in said multiplier factor, the process being performed in said steps (b) to (d) by using said logic NOT number as the multiplier factor, said method of automatically designing a logic circuit further comprising the steps of (g) generating information on a product correcting circuit for calculating the product of the original multiplier factor and said multiplicand, based on the product of said logic NOT number and said multiplicand.

The above apparatus for automatically designing a logic circuit further comprises: a third circuit information generating means for generating information on a logic NOT generating circuit for providing the logic NOT number of said multiplier factor, which is obtained by inverting all the bits in said multiplier factor by the logic NOT operation, if the number of the bits having the value of 1 in said multiplier factor is about ½ or more of the number of all the bits in said multiplier factor, said detecting means, first circuit information generating means, and second circuit information generating means performing the process by using said logic NOT number as the multiplier factor, said apparatus for automatically designing a logic circuit further comprising a fourth circuit information generating means for generating information on a product correcting circuit for calculating the product of the original multiplier factor and said multiplicand, based on the product of said logic NOT number and said multiplicand.

Thus, if the number of the bits having the value of 1 in the multiplier factor is about ½ or more of the number of all the bits in the multiplier factor, information on a logic NOT circuit for generating the logic NOT number of the multiplier factor is generated, and information on a circuit which performs multiplication by using the resulting logic NOT number as the multiplier factor, i.e., by using the multiplier factor in which a smaller number of bits have the value of 1 is generated. Consequently, it becomes possible to easily constitute a higher-speed multiplier or a multiplier composed of a smaller-size circuit.

To attain the above object, a multiplier which receives a signal X representing an n-bit number and a signal A representing an m-bit constant as its inputs and outputs their product P having the bit width of (n+m), comprises: a multiplying means which receives the logic NOT signal A0 of said constant A and said signal X as its inputs and outputs a signal P0 representing their product; and a correcting means which receives said signal X and signal P0 as its inputs, calculates $X*(2^m-1)-P0$, and outputs the result of calculation as said P.

With the above structure, the multiplying means multiplies the multiplicand X by the multiplier factor A0 which is obtained by inverting all the bits in the multiplier A by the logic NOT operation. Hence, even when the number of the bits having the value of 1 is about ½ or more of the number of all the bits in the multiplier A, the number of partial products can be reduced to m/2 or less, resulting in the reduction in circuit area and the increase in multiplication speed.

BRIEF DESCRIPTION OF THE DRAWINGS

FIGS. 10(a) to 10(c) are views showing conversion rule 1;

FIG. 15 is a flow chart showing the process of generating add shift multiplier of Step 144 of FIG. 12 in detail;

FIG. 17 is a view illustrating the internal representation of the conversion rule 3;

DETAILED DESCRIPTION OF THE PREFERRED EMBODIMENTS

Below, embodiments of the present invention will be described with reference to the drawings.

EXAMPLE 1

Figure 1:
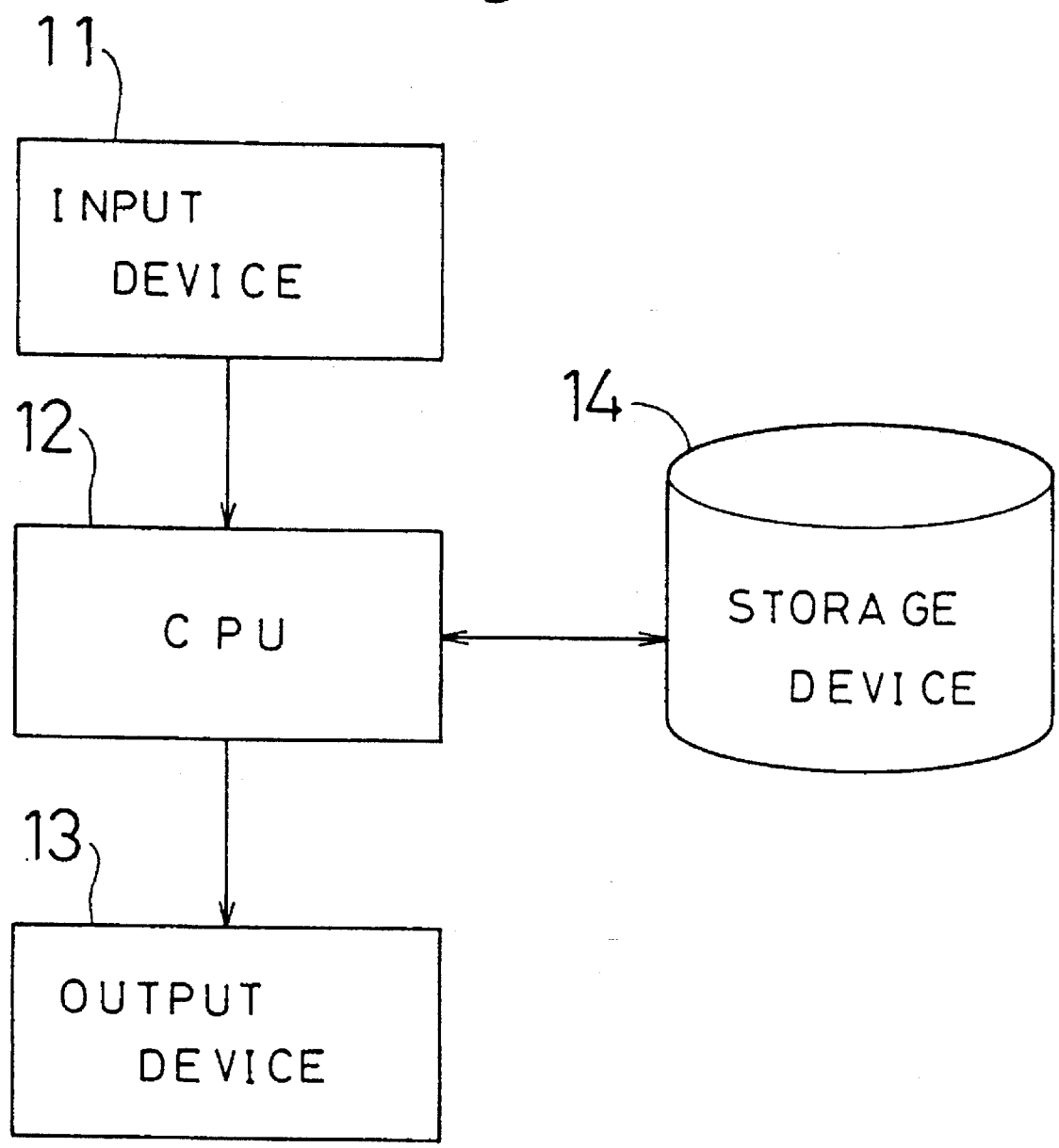
FIG. 1 is a block diagram showing the hardware structure of an automatic logic-circuit designing system according to the first embodiment of the present invention.

FIG. 1 is a block diagram showing an example of the hardware structure of an automatic logic-circuit designing system.

In FIG. 1, an input device 11 is for inputting functional description information on a circuit to be designed by the automatic designing system. The input device 11 can be composed of a keyboard, mouse, light pen, card reader, or schematic entry system. Aside from the foregoing devices that accept the inputting of information through a direct operation by an operator, it can also be composed of a magnetic disk device, which stores information preliminarily inputted through the foregoing devices as a file, or of an network device which receives information sent from another device.

A CPU 12 is for performing circuit-designing processes such as logical synthesis or circuit optimization by executing a variety of processes, which will be described below.

An output device 13 is for outputting circuit information which is the result of the designing process by the CPU 12 or a variety of information on processing. The output device 13 can be composed of a graphic display, character display, printer, or plotter. The output device 13 can also be composed of the magnetic disk device or network device, similarly to the input device 11.

Figure 2:
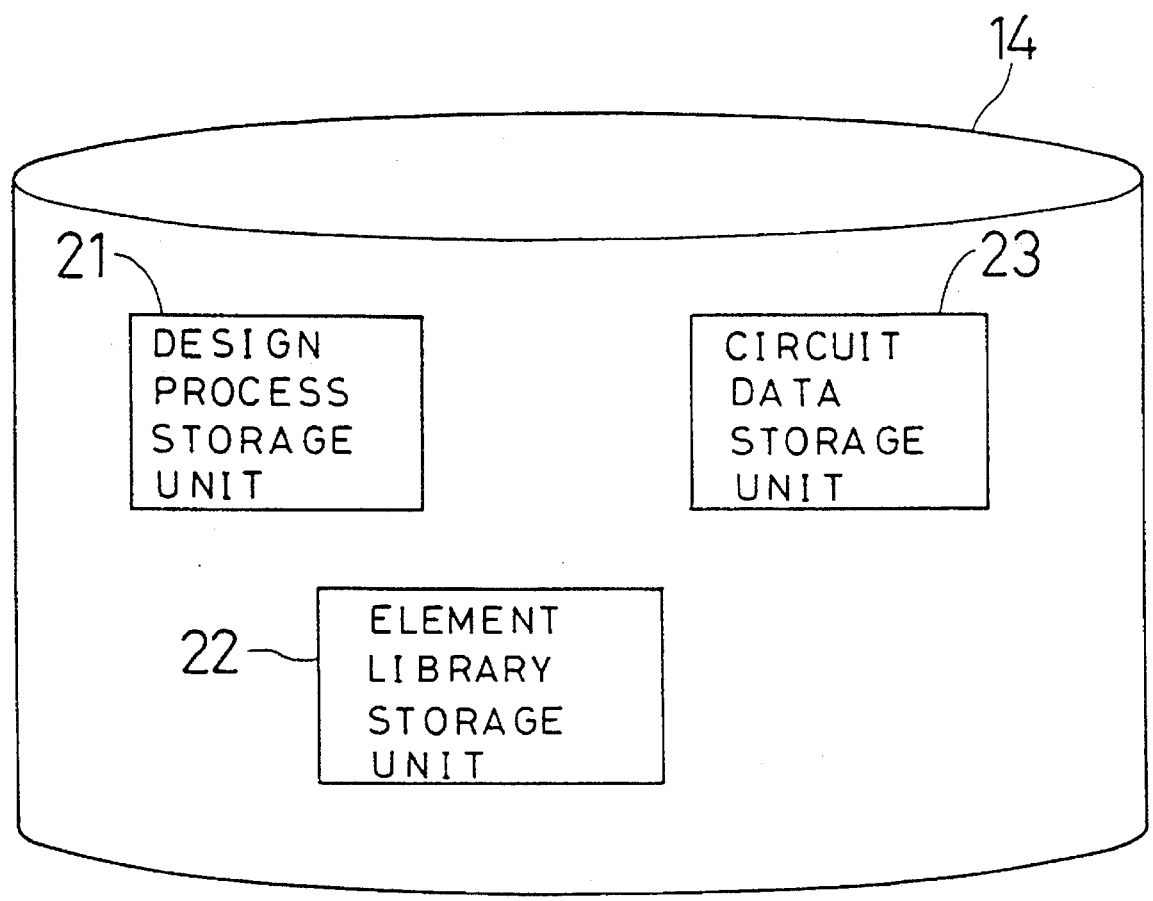
FIG. 2 is a view showing the structure of a storage device of the foregoing automatic designing system.

A storage device 14 consists of, for example, a design process storage unit 21, element library storage unit 22, and circuit data storage unit 23, as shown in FIG. 2, so that it can store information inputted through the input device 11 and programs or data on circuit-designing processes.

Specifically, the design process storage unit 21 stores a variety of programs whereby the foregoing CPU 12 executes design processes and conversion rule information to be applied in the course of these processes.

The element library storage unit 22 stores information on the functions of functional elements, logic elements, and mounted elements and on their area, delay time, and driving forces, so as to provide an element library.

The circuit data storage unit 23 stores functional description information which is inputted through the input device 11 and functional circuit information, logic circuit information, and mounted circuit information, each of which is generated by the circuit-designing processes.

The foregoing functional description information is mainly on a function required on a circuit, and is represented in a hardware description language. The functional circuit information is mainly on a circuit that is composed of virtual functional elements, the functions of which are only defined, and is represented in an internal representation form. The logic circuit information shows a circuit composed of real logic elements, which are on a logic level seldom dependent on the fabrication process or design methods. On the other hand, the mounted circuit information is greatly dependent on the fabrication process and design methods and shows a circuit to which are allotted elements actually mounted by a specified technology (e.g., a standard cell composed of a CMOS transistor, a cell in the library of a gate array, or TTL, ECL, and the like which are dependent on the fabrication process).

Examples of the foregoing functional elements are shown in Table 2. For example, a multiple-bit adder represents a functional element for adding two multiple-bit numbers. A comparator represents a functional element for comparing two multiple-bit numbers. A multiple-bit AND represents a functional element for calculating bit-by-bit logic products of two multiple-bit signals. A multiple-bit INV represents a logical element for calculating bit-by-bit logic NOTs in a multiple-bit signal.

A ripper is a functional element for conveniently dividing a multiple-bit signal during the course of conversion process. On the other hand, a mixer is a functional element for conveniently processing the multiple-bit signal as a whole. The ripper and mixer are functional elements which are eventually converted to a circuit composed of mounted elements and eliminated when all signals are processed in 1-bit signals.

In general, there exists no circuit that is composed of mounted elements directly corresponding to these functional elements. The functional elements are expanded to a circuit composed of real logic elements which realize their functions, and then replaced by a circuit composed of mounted elements.

---
MULTIPLE-BIT ADDER
MULTIPLE-BIT SUBTRACTER
MULTIPLE-BIT MULTIPLIER
MULTIPLE-BIT DIVIDER
COMPARATOR
ENCODER
DECODER
SELECTOR
MULTIPLEXER
COUNTER
LATCH
FLIP-FLOP
BUFFER
REGISTER
SHIFTER
MIXER
RIPPER
MULTIPLE-BIT AND
MULTIPLE-BIT NAND
MULTIPLE-BIT OR
MULTIPLE-BIT NOR
MULTIPLE-BIT XOR
MULTIPLE-BIT INV
---

Examples of the logic elements are shown in Table 3, in which, BIT-BY-BIT ADDER represents an element for adding two 1-bit signals and 1-BIT AND represents a logic element for calculating the logic product of two or more 1-bit signals.

The circuit composed of mounted elements corresponding to these logic elements are preliminarily determined so that the logic elements are eventually replaced by the circuit on the final stage of design processing.

---
BIT-BY-BIT ADDER
1-BIT AND
1-BIT NAND
1-BIT OR
1-BIT NOR
1-BIT XOR
1-BIT INV
---

Next, specific examples of the functional description information and of the functional circuit information to be stored in the circuit data storage unit 23 will be described. These sets of information are stored as, e.g., text information.

Figures 3A, 3B, 3C:
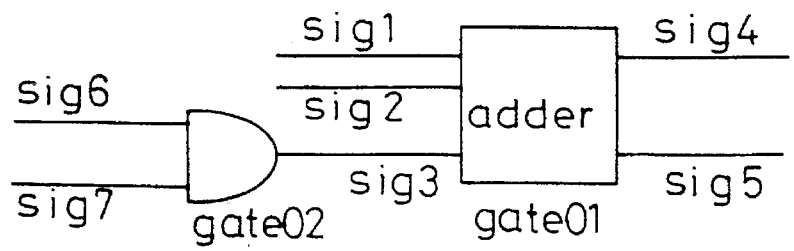
FIGS. 3(a) to 3(c) are views showing a circuit to be stored in a circuit data storage unit of the foregoing storage device, functional description information on the circuit, and functional circuit information on the circuit, respectively.

A circuit composed of, e.g., 1-bit 2-input AND gate and a 1-bit 3-input adder shown in FIG. 3(a) is described in the functional description information shown in FIG. 3(b). The functional description information is converted to the functional circuit information or logic circuit information shown in FIG. 3(c). The functional circuits information and logic circuit information may not particularly be distinguished from each other in the case shown above where the functional description information corresponds directly to the circuit composed of the functional elements.

In this example, the functional circuit information includes an identification name 31 for identifying an individual element and a plurality of pairs of attribute code 32 and attribute value 33. The attribute code 32 and attribute value 33 in each pair are mapped with " : : ". The individual pairs are separated by " ; ", and the identification names 31 are separated from other information by " : : : ". The attribute codes 32 include "a_kind_of", "input", "output", and the like, each showing that its corresponding attribute value 33 refers to the type of element, its input signal, and its output signal.

That is, the element of the gate 01 is an adder, its input signals are sig1, sig2, and sig3, and its output signals are sig4 and sig5. On the other hand, the element of the gate 02 is an AND, its input signals are sig6 and sig7, and its output signal is sig3. It is also shown that the gate01 and gate02 are connected by the signal sig3.

Figures 4A, 4B, 4C:
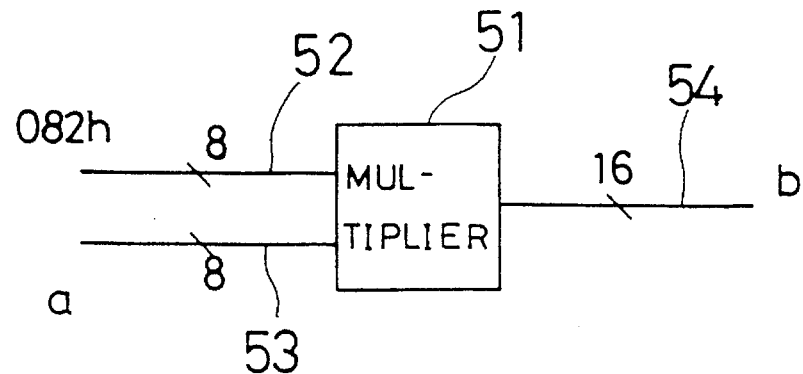
FIGS. 4(a) to 4(c) are views showing a circuit including a multiplier as a functional element, functional description information on the circuit, and functional circuit information on the circuit, respectively.

Similarly, a circuit composed of a multiplier 51 serving as a functional element, a signal line 52 to which an 8-bit constant having the value of 130 (82 h in the hexadecimal notation) is inputted as a multiplier factor, a signal line 53 to which an 8-bit multiplicand a is inputted, and a signal line 54 which outputs a 16-bit multiplication result b, as shown in FIG. 4(a), is described in the functional description information shown in FIG. 4(b), and is converted to the functional circuit information as shown in FIG. 4(c). Here, the distinction between the multiplier factor and the multiplicand is provided for the convenience of conversion processes.

In the functional description information of FIG. 4(b), the multiplicand a is a signal having the bit width of 8 ranging from 0 bit to 7 bit. The variable b is a signal having the width of 16 ranging from 0 bit to 15 bit. It is shown that the value of the variable b is the product of the multiplicand a and the multiplier factor 130 which is represented by an 8-bit signal having the value of 130.

In the functional circuit information of FIG. 4(c), the first line shows that the functional element has the identification name of gate1 and it serves as a multiplier. The descriptions in the second and fourth lines show that the signal represented by a sign i1 is an 8-bit input signal a having the value of 130. The descriptions in the third and fifth lines show that the signal represented by a sign i2 is an 8-bit input signal which is a constant. The description in the sixth line shows that the signal represented by a sign o is a 16-bit output signal b.

For simplicity, the content of information will be shown in the following description by such schematic diagrams as shown in FIG. 3(a) and in FIG. 4(a), irrespective of the types of information such as the functional description information, functional circuit information, and logic circuit information. If necessary, such terms as multiplier factor and multiplicand will also be used as their values or signals which represent the multiplier factor and multiplicand, and the term circuit will also be used as information which represents a circuit, provided that they are not causing a confusion.

The following description will also use the notation shown below.

A number having the bit width of (a−b+1) ranging from the a-th bit to the b-th bit (a>b) from the least significant digit is designated by X(a:b), while the a-th bit in the number X is designated by X(a).

Moreover, a function will be defined as follows.

For a k-bit signal Y, the number of bits having the value of 1 is defined as posibits (Y), while the number of bits having the value of 0 is defined as negabits (Y).

The number of bits, which is obtained by calculating the number of the bits having the value of 1 from the least significant value till it becomes P(P<k), is defined as effbitwidth (Y, P). Since the processes for obtaining the values of these functions can easily be realized, the detailed description thereof will be omitted.

Next, the design processes to be implemented by the automatic designing system will be described below.

Figure 5:
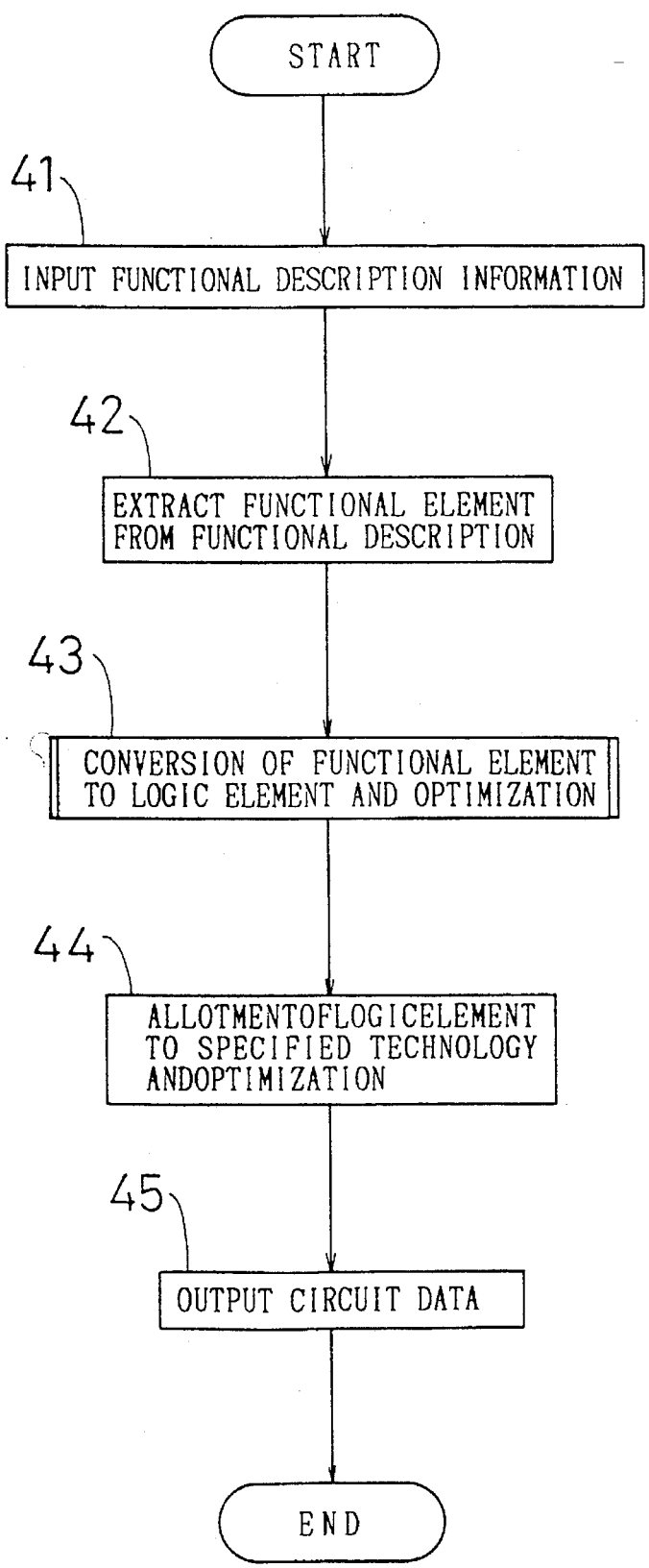
FIG. 5 is a flow chart of the main routine showing the designing process of the foregoing automatic designing system.

FIG. 5 is a flow chart showing the main routine of the designing process.

In Step 41 is performed a process of inputting the functional description information formed on the basis of the functional specification by a functional designer of the circuit through the input device 11 and storing it in the circuit data storage unit 23. It is also possible to design the input device 11 so that it accepts the inputting of not only the functional description information but also the functional circuit information and logic circuit information on comparatively simple portions of the circuit.

In Step 42 is performed a process of interpreting the functional description information which was inputted in Step 41, generating functional circuit information in which a circuit consisting of the functional elements and having the function shown in the functional description information is represented in the internal representation form, and storing it in the circuit data storage unit 23.

In Step 43 is performed a process of converting all the functional elements contained in the functional circuit information to logic elements and storing the resulting logic circuit information in the circuit data storage unit 23. As for the circuit including a multiplier, the circuit optimization on the level of functional elements is also performed. The process of Step 43 will be described later in detail.

In Step 44 is performed a process of allotting all the logic elements contained in the logic circuit information to mounted elements through the element conversion process based on specified conversion rule information. In this step is also performed circuit optimization on the level of logic elements during the course of allotting the logic elements to the mounted element.

In step 45 is performed a process of generating a circuit diagram and net list based on mounted circuit information and the like and outputting them to the output device 13. The net list mentioned above refers to information on, e.g., the connections between the mounted elements in the circuit constituted by the mounted elements.

The processes performed in above Steps 42 and 44 are the same as those disclosed in Japanese Laid-open Patent Publication no. 3-15984 and in U.S. Pat. No. 5,043,914, so that the detailed description thereof is omitted here.

Figure 6:
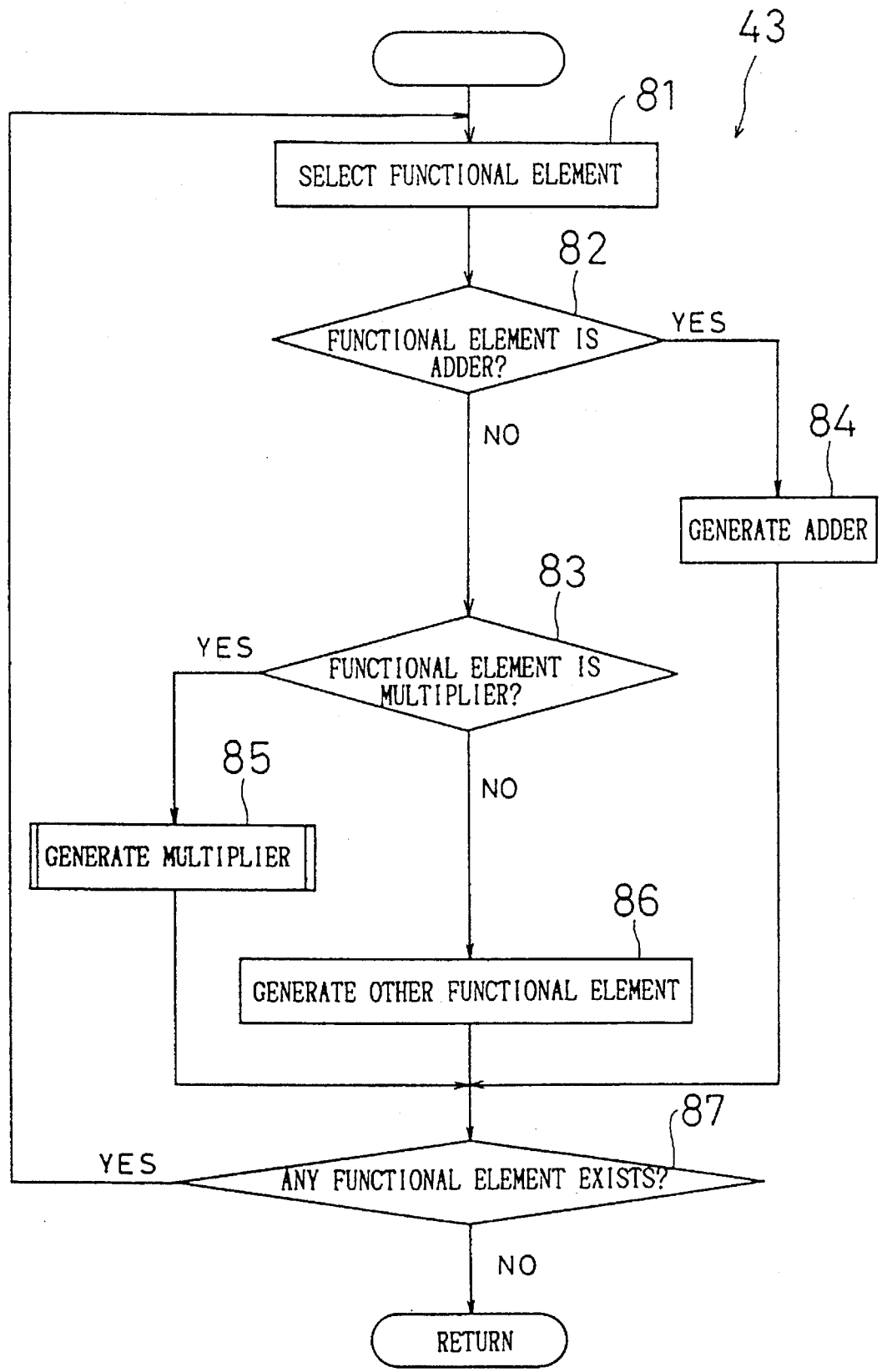
FIG. 6 is a flow chart showing the process of conversion of functional element of Step 43 in detail.
Figure 7A:
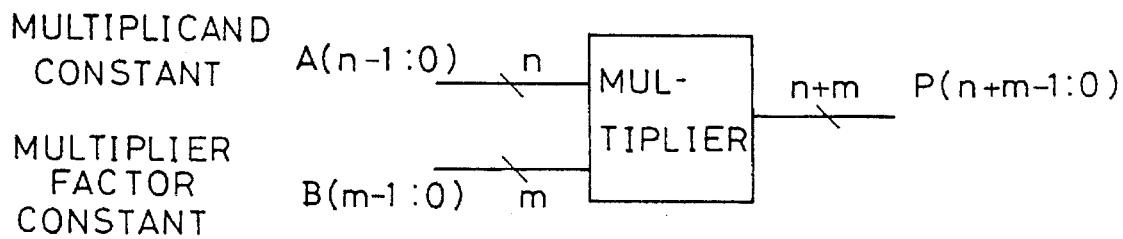
FIGS. 7(a) to 7(d) are views showing a multiplier as a functional element.
Figure 7B:
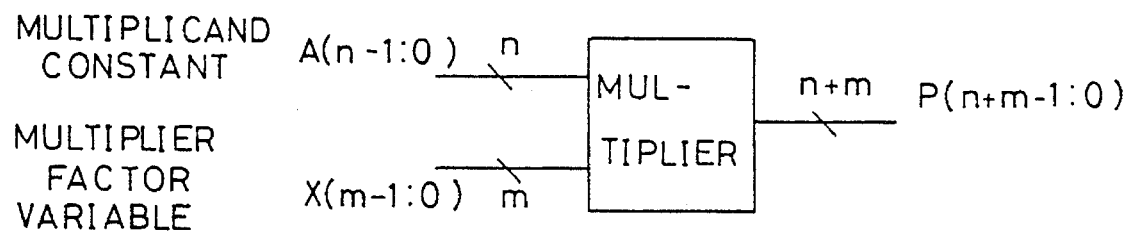
Figure 7C:
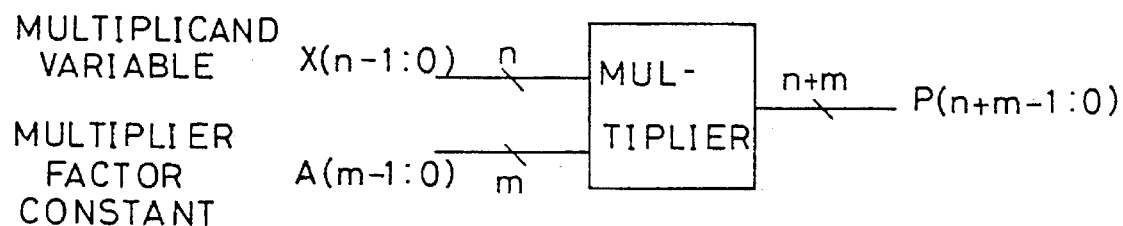
Figure 7D:
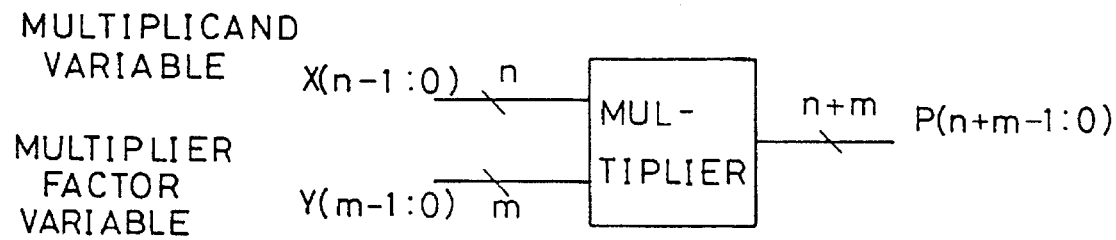

In above Step 43, the process shown in detail in FIG. 6 is performed.

In Step 81, one of the functional elements included in the functional circuit information is selected.

In Steps 82 and 83, it is determined whether or not the selected functional element is an adder or a multiplier. If it is an adder, the process goes on to Step 84. If it is a multiplier, the process goes on to Step 85. If it is neither an adder nor a multiplier, the process goes on to Step 86.

In each of Steps 84 to 86, the selected functional element is converted to a circuit having the same function which is constituted by at least either of other functional elements and logic elements. After its circuit information is generated, the process goes on to Step 87.

In Step 87, it is determined whether or not the circuit includes a functional element. If it does, the process goes back to Step 81 so as to repeat the similar processing. If it does not, which means that the circuit obtained by conversion is constituted only by logic circuits, the process returns to the main routine.

In above Steps 84 to 86, a single conversion process does not necessarily provide a circuit that is constituted only by logic elements. Instead, the circuit resulting from the conversion may temporarily include other functional elements. In this case, it is determined in Step 87 that a functional element is included and, by recursively performing similar conversion processes, a circuit constituted only by logic circuits is eventually obtained. Specifically, a multiple-bit adder is repeatedly converted to an adder having a smaller number of bits (functional element) and to a 1-bit adder (logical element) in Step 84, resulting in a circuit constituted only by 1-bit adders. On the other hand, a subtracter and a divider are converted to a circuit composed of functional elements such as adders and of logic circuits in Step 86, and then the functional elements such as adders are converted to 1-bit adders in Step 84. Thus, by recursively performing the conversion processes, the individual processes will easily be simplified.

The multiplier which is determined as such with "yes" in Step 83 and which is subjected to conversion in Step 85 is provided with the function shown in FIGS. 7(a) to 7(d). The multipliers are the same in that each of them has the function of multiplying a multiplicand represented by an n-bit signal by a multiplier factor represented by an m-bit signal so as to output a product P represented by a signal having the bit width of (n+m). However, they are different in that the multiplier factor and multiplicand which are inputted thereto are a constant A, constant B, variable X, or variable Y. For simplicity, the constant A will be treated as a positive number in the following description. In the case where the constant A is an negative number, the sign of the constant A is inverted so as to generate information on the multiply circuit with respect to the resulting constant A' with the inverted sign and on the circuit for inverting the sign of the multiplication result, thereby providing the proper procedure. In the following description, the variable X may have a positive or negative value.

Below, the conversion process performed in above Step 85 will be described in detail by using a multiplier shown in FIG. 7 in accordance with the flow chart of FIG. 8. The process is for converting the multiplier to a circuit constituted by other functional elements such as multipliers and adders or by logic elements.

In Step 1001, it is determined whether or not each of the multiplier factor and multiplicand is a constant or not. If the answer is yes, as shown in FIG. 7(*a*), the process goes on to Step 1002 where their product is calculated and conversion is made to a circuit which generates a signal representing its value in binary code. Specifically, if the multiplicand X=4 and the multiplier factor A=5, conversion is made to a circuit which outputs a signal representing the value of 4×5=20 ('10100' in binary code) as P(4:0) and a signal representing the value of 0 as P(n+m−1:5), as shown in FIG. 9(*a*).

If it is determined in Step 1001 that at least either of the multiplier factor or multiplicand is a variable, the process goes on to Step 1003 where it is determined whether or not the multiplicand is a constant, and if the multiplicand is a constant, the multiplier factor and multiplicand are interchanged in Step 1004 so that the process goes on to Step 1005. If the multiplicand is not a constant, on the other hand, the process directly goes on to Step 1005. That is, in the case of using the multiplier shown in FIG. 7(*b*), it is converted to the multiplier shown in FIG. 7(*c*) so that at least the multiplicand is constantly a variable.

In Steps 1005, 1007, and 1009, it is determined whether or not the multiplier factor is a special constant, i.e., its value is 0, 1, or a number obtained by raising 2 to a certain power. If the multiplier factor is 0, conversion is made to a circuit for outputting a signal which shows that the values of all the bits are 0, as shown in FIG. 9(*b*) (Step 1006). If the multiplier factor is 1, conversion is made to a circuit which outputs a signal representing the value of the multiplicand as P(n−1:0), while outputting a signal having the value of X(n−1) as P(n+m−1:n) by sign extension (Step 1008). If the multiplier factor is a number obtained by raising 2 to a certain power, e.g., if it is 8 (=$2^3$), conversion is made to a circuit which outputs a signal representing the value of the multiplicand as P(n+2:3), outputs a signal having the value of 0 as P(2:0), and outputs a signal in which the value of each bit is X(n−1) as P(n+m−1:n+3) by sign extension, as shown in FIG. 9(*d*) (Step 1010).

In Step 1011, it is determined whether the multiplier factor is composed of 1 bit or 2 or more bits. If it is composed of 1 bit, as shown in FIG. 10(*a*), the process goes on to Step 1012, where conversion is made to a circuit composed of AND circuits 132 to 135 as shown in FIG. 10(*b*). The determination of 1 bit in Step 1011 is limited to the case where the multiplier factor is a variable, because, if the multiplier factor is a 1-bit constant, the answers obtained in above Steps 1005 and 1007 must have been 'yes'. The determination of 2 or more bits includes the cases where the multiplier factor is a variable and where the multiplier factor is a constant.

Figure 11:
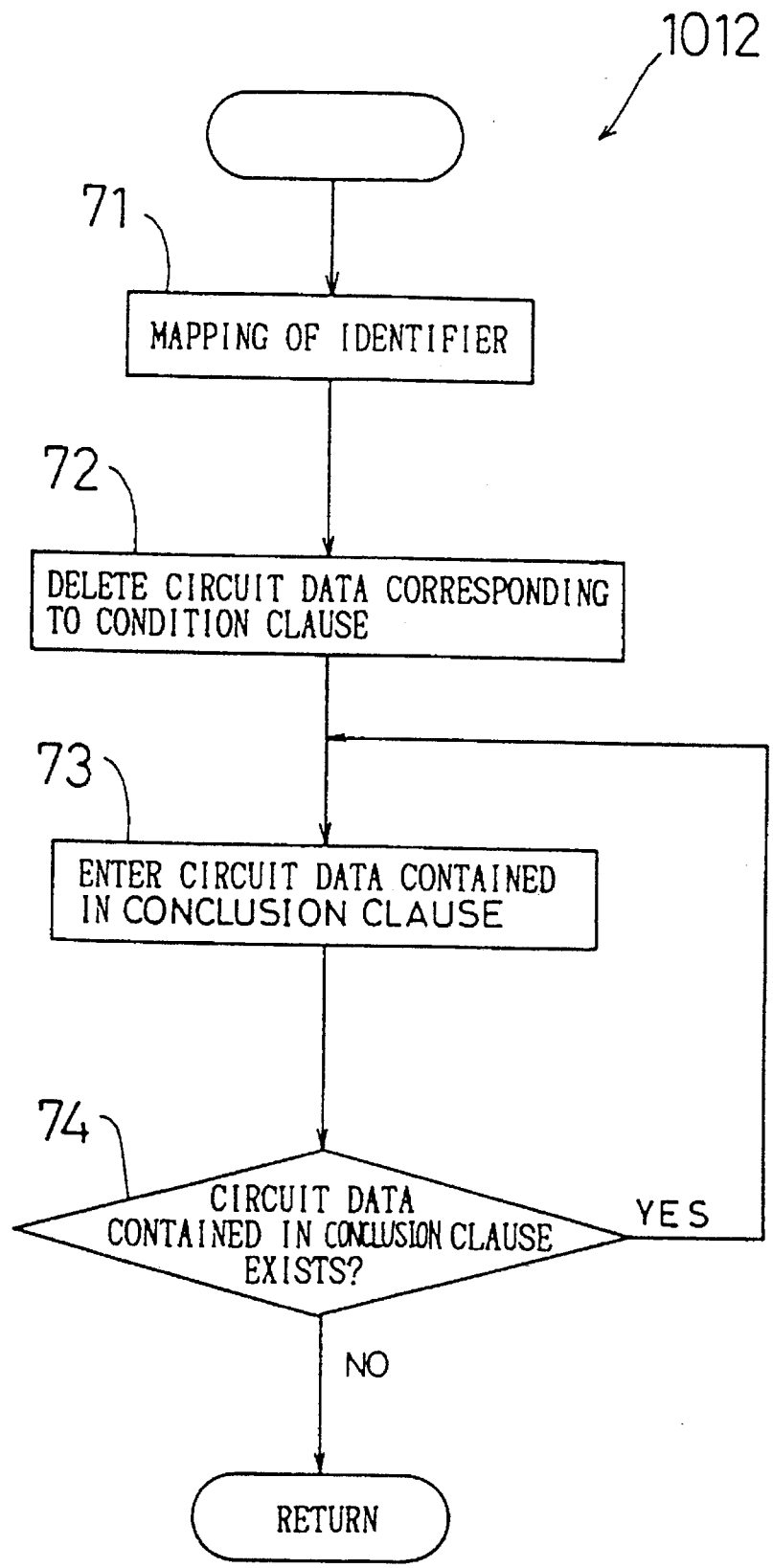
FIG. 11 is a flow chart showing the process of conversion of functional element of Step 1012 of FIG. 8 in detail.

In above Steps 1006, 1008, 1010, and 1012, conversion to a circuit is performed based on the conversion rule information which is preliminarily stored in the design process storage unit 21. For example, the conversion of step 1012 is performed based on conversion rule 1 shown in FIG. 10(*c*) by following the process shown in FIG. 11.

First, in Step 71, a condition clause precedent to "= = >" in the conversion rule information is compared with the initial circuit information. If it satisfies a conversion application condition, the names of signal lines and the like are mapped.

In Step 72, the circuit information on the initial multiplier as a functional element is deleted from the circuit data storage unit 23.

In Step 73, information on a circuit to be obtained after conversion is generated on the basis of the circuit information on functional elements or logic elements shown in a condition clause subsequent to "= = >" in the conversion rule information and of the foregoing mapping. The resulting information is then entered in the circuit data storage unit 23.

In Step 74, it is determined whether or not unprocessed functional or logic elements remain in the condition clause. If the answer is yes, the process goes back to above Step 73. If the answer is no, on the contrary, the process returns to the initial process.

The proof of conversion to a circuit which is equivalent to the initial multiplier according to the foregoing conversion rule 1 will be achieved later along with the proof of other conversion rules. However, since a specific process of converting elements is disclosed in U.S. Pat. No. 5,043,914, the detailed description thereof will be omitted. Although the conversion rule information is actually represented in the internal representation form as shown in FIG. 10(*c*), it will principally be illustrated in the following description by such schematic diagrams as shown in FIGS. 10(*a*) and 10(*b*) for simplification.

If it is determined that the multiplier factor is composed of 2 or more bits in above Step 1011, the process goes on to Step 1013, where conversion is made to a multiple-bit multiplier composed of at least either of other functional elements (multiplier or adder having a reduced bit width) and logic elements.

Figure 12:
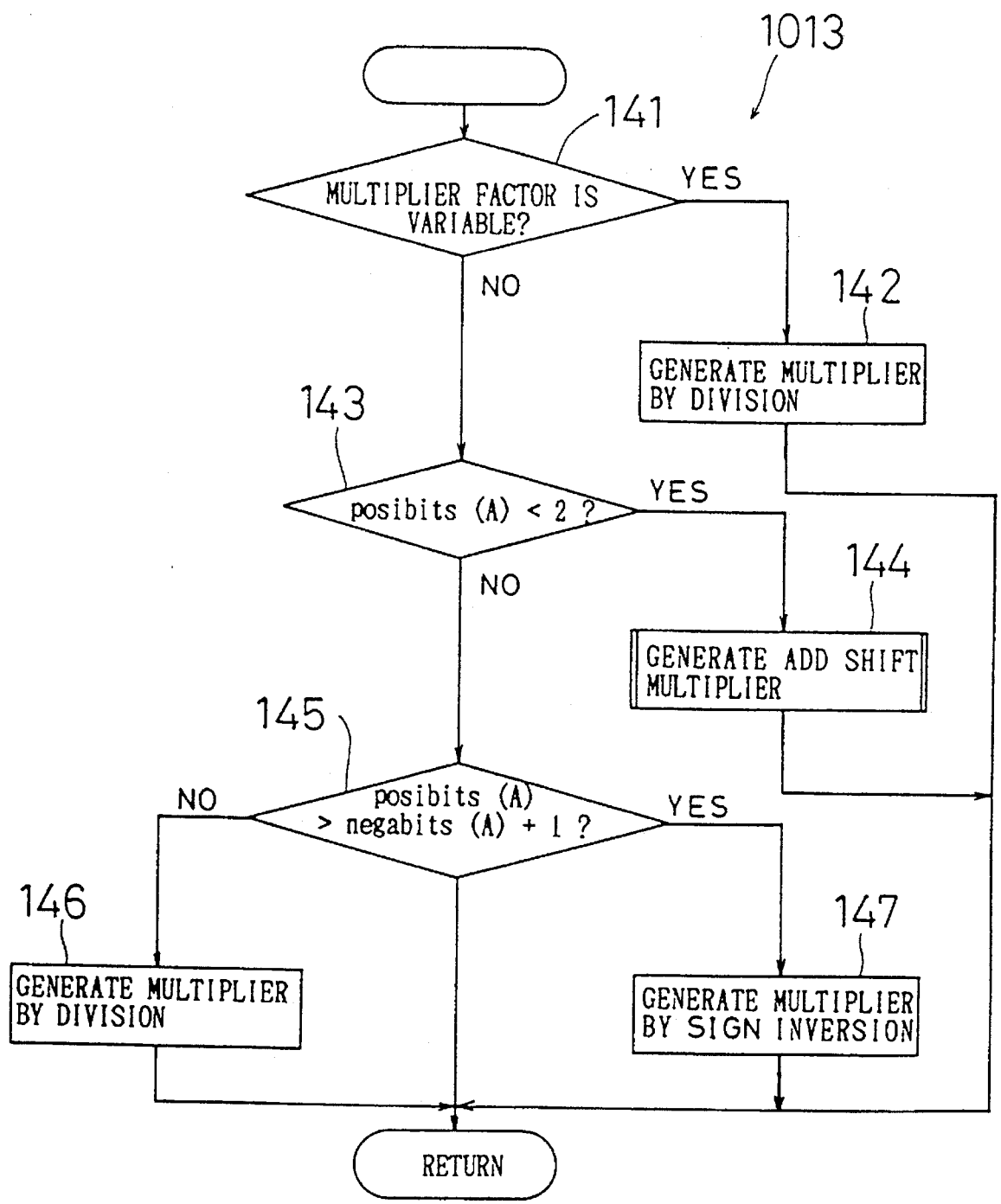
FIG. 12 is a flow chart showing the process of generating multiple bit multiplier of Step 1013 of FIG. 8 in detail.

FIG. 12 is a flow chart showing the process performed in above Step 1013 in detail. In the process, the number of partial products and the number of logic stages for calculating the sum of the partial products are mostly reduced in the following manner.

In the case where the multiplier factor is a constant, conversion is made to a circuit which calculates a partial product only with respect to a bit having the value of 1 in the multiplier factor or in a logic NOT number which is obtained by inverting all the bits in the multiplier factor by the logic NOT operation, thereby reducing the number of the partial products. In each of the cases where the multiplier factor is a constant and where the multiplier factor is a variable, conversion is made to a circuit in which an adder is connected so as to form a binary tree, thereby reducing the number of logic stages in the circuit for calculating the sum of the partial products.

First, in Step 141, it is determined whether or not the multiplier is a variable or not. If the answer is yes, it follows that multiplication will be performed by using variables as its multiplier factor and multiplicand, so that the process goes on to Step 142. In Step 142, conversion is made, according to conversion rule 2, to a circuit including two multipliers in which the multiplier factor having the bit width of about ½ is used.

According to the foregoing conversion rule 2, a multiplier 191, which outputs a product P by multiplying an n-bit multiplicand X by an m-bit multiplier factor Y, is converted to a circuit consisting of multipliers 192 and 193, which calculates partial products P1 and P2 by multiplying the multiplicand X by the low-order K bits and high-order (m−K) bits of the multiplier factor Y, respectively, and of a circuit for adding the resulting partial products P1 and P2. However, since it is sufficient for the foregoing circuit to perform addition only with respect to the overlapping bit of the partial products P1 and P2 and to the bits higher than the overlapping bit, it is constituted by a ripper 194 for separating the high-order n bits of the partial product P1 from its low-order K bits, mixer 195 for outputting a signal R1 obtained by extending the sign of the high-order n bits, and an adder 196 for adding the signal R1 and the partial product P2.

More specifically, the foregoing multiplier 192 is a circuit for multiplying the multiplicand X (n–1:0) by the low-order K bits Y1=Y(K–1:0) of the multiplier factor Y and outputting a signal P1 (n+K–1:0) having the bit width of (n+K) as a partial product.

On the other hand, the multiplier 193 is a circuit for multiplying the multiplicand X (n–1:0) by the high-order (m–K) bits Y2=Y(m–1:K) of the multiplier factor Y and outputting a signal P2 (n+m–K–1:0) having the bit width of (n+m–K) as a partial product.

The ripper 194 is a circuit for dividing the foregoing signal P1 (n+K–1:0) into a signal P1 (n+K–1:K) composed of the high-order n bits and a signal P1 (K–1:0) composed of the low-order K bits. The latter signal P1 (K–1:0) is outputted as a signal P (K–1:0) representing the low-order K bits of the product P.

The mixer 195 is a circuit for gathering a signal having the bit width of (m–K), in which the value of each bit is P1 (n+K–1), in the high order of the signal P1 (n+K–1:K) and for outputting a signal R1 (n+m–K–1:0) having the bit width of (n+m–K) by extending the sign of the signal P1.

The adder 196 is a circuit for adding the foregoing signal P2 (n+m–K–1:0) and the signal R1 (n+m–K–1:0) and for outputting a signal R2 (n+m–K–1:0) having the bit width of (n+m–K), which is the sum of the foregoing signals, as a signal P (n+m–1:K) representing the high-order (n+m–K) bits of the product P.

If the respective bit widths K and (m–K) of the multiplier factors to be inputted to the multipliers 192 and 193 included in the circuit obtained by conversion are 2 or more (i.e., the multipliers obtained by conversion are also functional elements), conversion is made to a circuit including multipliers having a further reduced bit width, while Step 142 is executed in the process of the next loop. Conversely, if either of the respective bit widths K and (m–K) of the multiplier factors becomes 1, conversion is made to a circuit consisting of AND circuits (logic elements) in the process of above Step 1012 (FIG. 8).

Here, the value of above K is set to the minimum integer equal to or more than m/2 or to the maximum integer equal to or less than m/2, that is, to an integer which minimizes the absolute value of the difference (m–2K) between K and (m–K). Alternatively, the value of above K is set so that the either K or (m–K) becomes the minimum value obtained by raising 2 to a certain power that is equal to or more than m/2. Thus, the number of logic stages in the case of constituting the circuit for obtaining the sum of partial products so that the adder is connected to form a well-balanced binary tree can be reduced.

Figure 14:
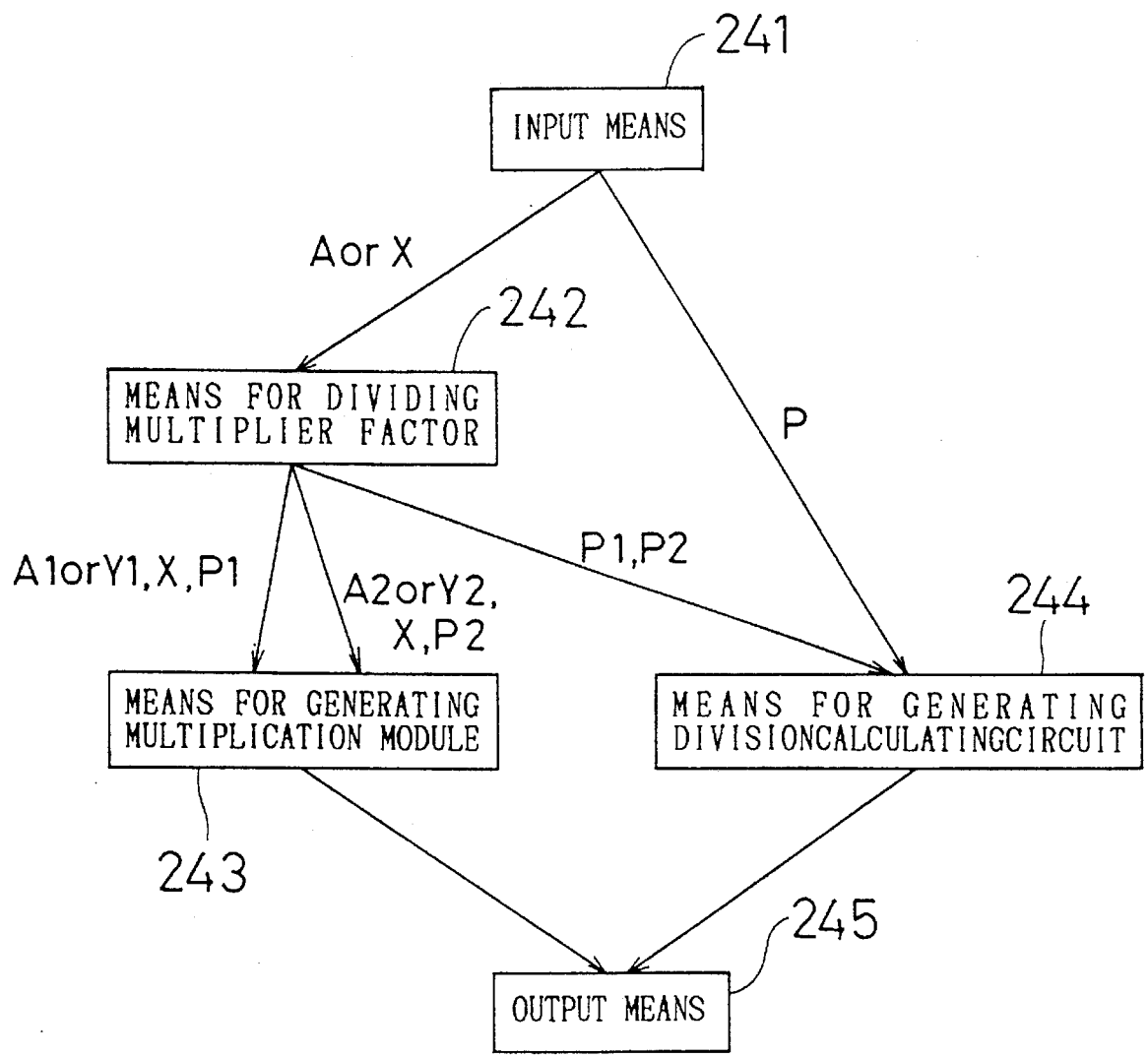
FIG. 14 is a block diagram showing the structure for performing the process of Step 142 of FIG. 12 in terms of its function.

FIG. 14 is a view showing the structure for performing the process of above Step 142 in terms of its function.

In the drawing, an input means 241 reads the circuit information on the initial multiplier 191 as a functional element out of the circuit data storage unit 23, and then outputs, to a means 242 for dividing multiplier factor, the information which shows that the inputs to the multiplier 101 are the m-bit multiplier factor Y and the n-bit multiplicand X. The input means 241 also outputs, to a means 244 for generating division calculating circuit, the information which shows that the output from the multiplier 191 is the product P having the bit width of (m+n).

The means 242 for dividing multiplier factor initially calculates the value of K for dividing the multiplier factor Y, and then outputs, to a means 243 for generating multiplication module, information on the signal Y1 composed of the low-order K bits of the multiplier factor Y, multiplicand X, and partial product P1 and information on the signal Y2 composed of the high-order (m–K) bits of the multiplier factor Y, multiplicand X, and partial product P2. The means 242 for dividing multiplier factor also outputs respective sets of information on the partial products P1 and P2 to the means 244 for generating division calculating circuit. The names P1 and P2 of the foregoing partial products are allotted here by an allotting means (not shown).

The means 243 for generating multiplication module generates information on the multiplier 192 which multiplies the multiplicand X by the signal Y1 so as to obtain the partial product P1 and on the multiplier 193 which multiplies the multiplicand X by the signal Y2 so as to obtain the partial product P2, and then outputs the resulting information to an output means 245.

The means 244 for generating division calculating circuit outputs, to the output means 245, information on a circuit consisting of a ripper 194, mixer 195, and adder 196, which outputs, based on information on the partial products P1 and P2 and information on the product P, the low-order K bits of the partial product P1 as the low-order K bits of the product P while outputting the sum of the high-order (n–K) bits of the partial product P1 and partial product P2 as the high-order (n+m–K) bits of the product P.

The output means 245 stores the circuit information on the circuit obtained by conversion, which was outputted from the means 243 for generating multiplication module and from the means 244 for generating division calculating means.

With the multiplier which performs multiplication by using variables as its multiplier factor and multiplicand, conversion is not limited to the foregoing process that involves division. It is also possible to allot thereto a general purpose multiplier entered in the library or to convert it to a circuit using the 2-bit Booth's recode system, similarly to the conventional automatic designing system.

In above Step 141, if it is determined that the multiplier factor is a constant multiplier factor A, the process goes on to Step 143, where it is determined whether or not the posibits (A), which indicates the number of bits having the value of 1 in the multiplier factor A, is 2 or less. If the posibits (A) is 2 or less, the process goes on to Step 144. If the posibits (A) is 1, it must have been processed in above Step 1008 or 1010, so that the determination of 2 or less is limited to the case where the posibits (A) is 2. In Step 143, the value of m may also be determined. If the posibits (A) is 2, two values obtained by shifting the multiplicand X depending on the bit positions are added, thereby constituting a circuit for calculating partial products only with respect to the bits having the value of 1. Such a circuit may be formed by a single process, but in this case, conversion is made to a circuit having a (m–1)-bit multiplier which divides the multiplier factor A into the most significant 1 bit and the low-order (m–1) bits, while adding the product of the multiplicand X and the low-order (m–1) bits of the multiplier factor A and the value obtained by shifting the multiplicand X, so that recursive processing simplifies individual processes. However, if the most significant bit of the multiplier factor A is 0, it is sufficient to set the most significant bit of the product P to 0, so that the circuit for performing addition or the like is not necessary.

Figure 16A:
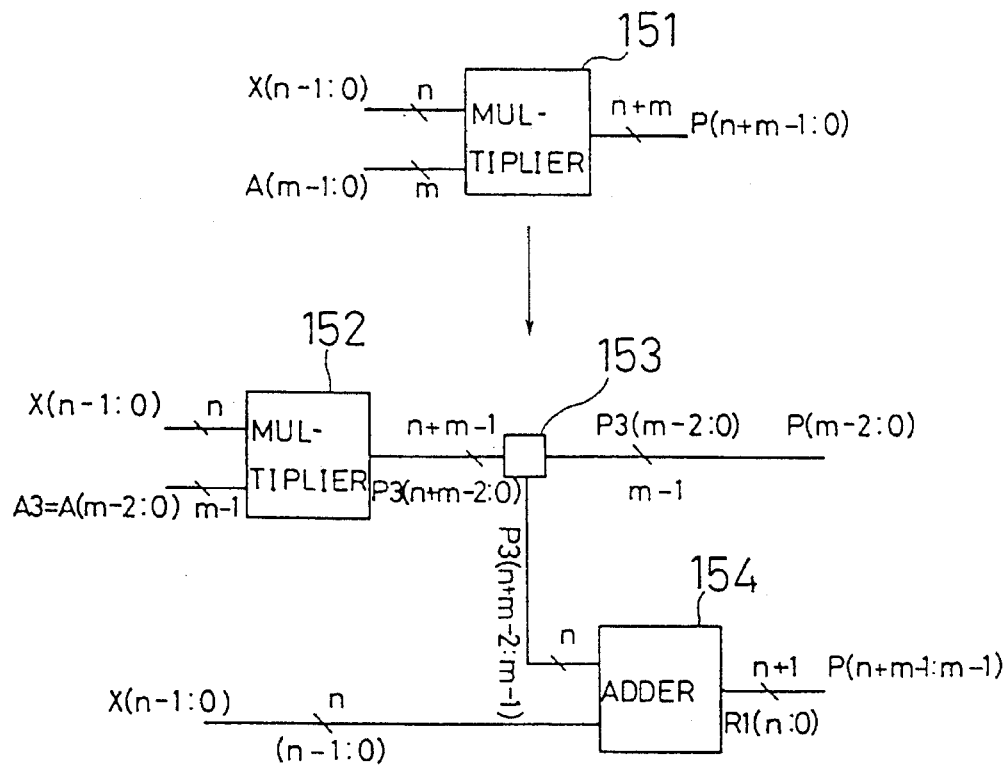
FIGS. 16(a) and 16(b) are views showing conversion rule 3 with FIG. 16(a) illustrating conversion rule 3(a) when the most significant bit is 1, and FIG. 16(b) illustrating conversion rule 3(b) when the most significant bit is 0.
Figure 16B:
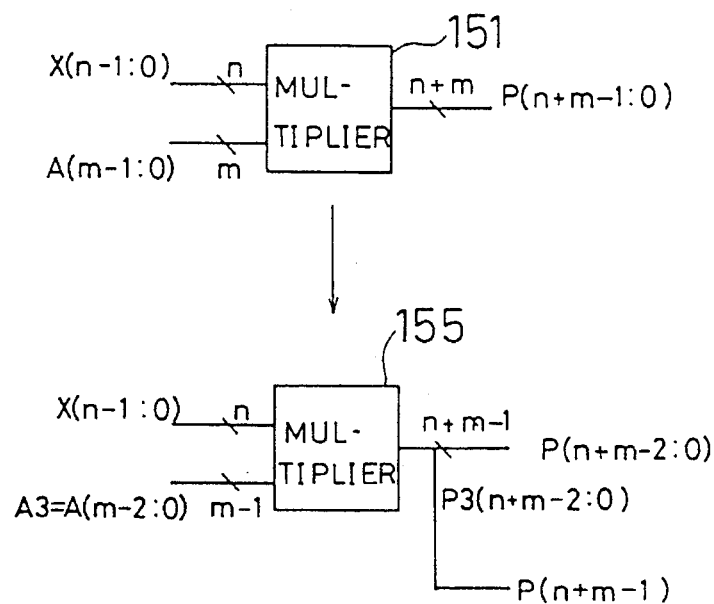

Hence in Step 144, which is shown in greater detail in FIG. 15, it is initially determined in Step 161 whether or not the most significant bit of the multiplier factor A is 1. If it is 1, the process goes on to Step 162, where conversion rule 3(a) shown in FIG. 16(a) is applied. Conversely, if it is 0, the process goes on to Step 163, where conversion rule 3(b) shown in FIG. 16(b) is applied. The conversion rule 3(a) and conversion rule 3(b) constitute conversion rule 3.

According to the conversion rule 3(a), a multiplier 151 is converted to a circuit consisting of a multiplier 152, ripper 153, and adder 154.

The multiplier 152 multiplies the multiplicand X (n−1:0) by the low-order (m−1) bits A3=A (m−2:0) of the multiplier factor A, so as to obtain a partial product P3 (n+m−2:0) having the bit width of (n+m−1).

The ripper 153 divides the partial product P3 into the high-order n bits P3 (n+m−2:m−1) and the low-order (m−1) bits P3 (m−2:0).

The adder 154 adds the foregoing P3 (n+m−2:m−1) and the multiplicand X (n−1:0) (logically, the product of the most significant bit of the multiplier factor A and the multiplicand X (n−1:0) as a partial product).

In the case where the process was performed, the value of posibits (A3) for the foregoing multiplier 152 becomes 1, so that the process of above Step 1008 or 1010 (FIG. 8) in the process of the next loop is performed.

The foregoing conversion rule 3(a) is stored in the design process storage unit 21 in the internal representation form shown in FIG. 17. In the drawing, "Gate" of the condition clause precedent to "==>" corresponds to the multiplier 151 of FIG. 16. On the other hand, "Gate 1" to "Gate 3" of the conclusion clause subsequent to "==>" correspond to the multiplier 152, ripper 153, and adder 154, respectively.

According to the conversion rule 3(b), the multiplier 151 is converted to a circuit having a multiplier 155, which multiplies the multiplicand X (n−1:0) by the low-order (m−1) bits A3=A (m−2:0) of the multiplier factor A, so that the obtained partial product having the bit width of (n+m−1) is outputted as the low-order (n+m−1) bits P (n+m−2:0) of the product P, while the value P (n+m−2) is outputted as the most significant bit P (n+m−1) of the product P. In this case, therefore, the multiplier 151 can be converted to a circuit including the multiplier having a reduced bit width without increasing the number of the partial products. In the case where the process was performed, the value of posibits (A3) for the multiplier 152 remains 2, so that Step 144 is executed again in the process of the next loop and conversion is made to a circuit which includes a multiplier having a further reduced bit width in Step 163, or conversion is made to a circuit which includes a multiplier having one bit the value of which is 1 in Step 162.

Instead of dividing the multiplier factor A into the most significant 1 bit and the low-order (m−1) bits, as described above, it is also possible to divide the multiplier factor A into the high-order (m−1) bits and the least significant bit.

Figure 18:
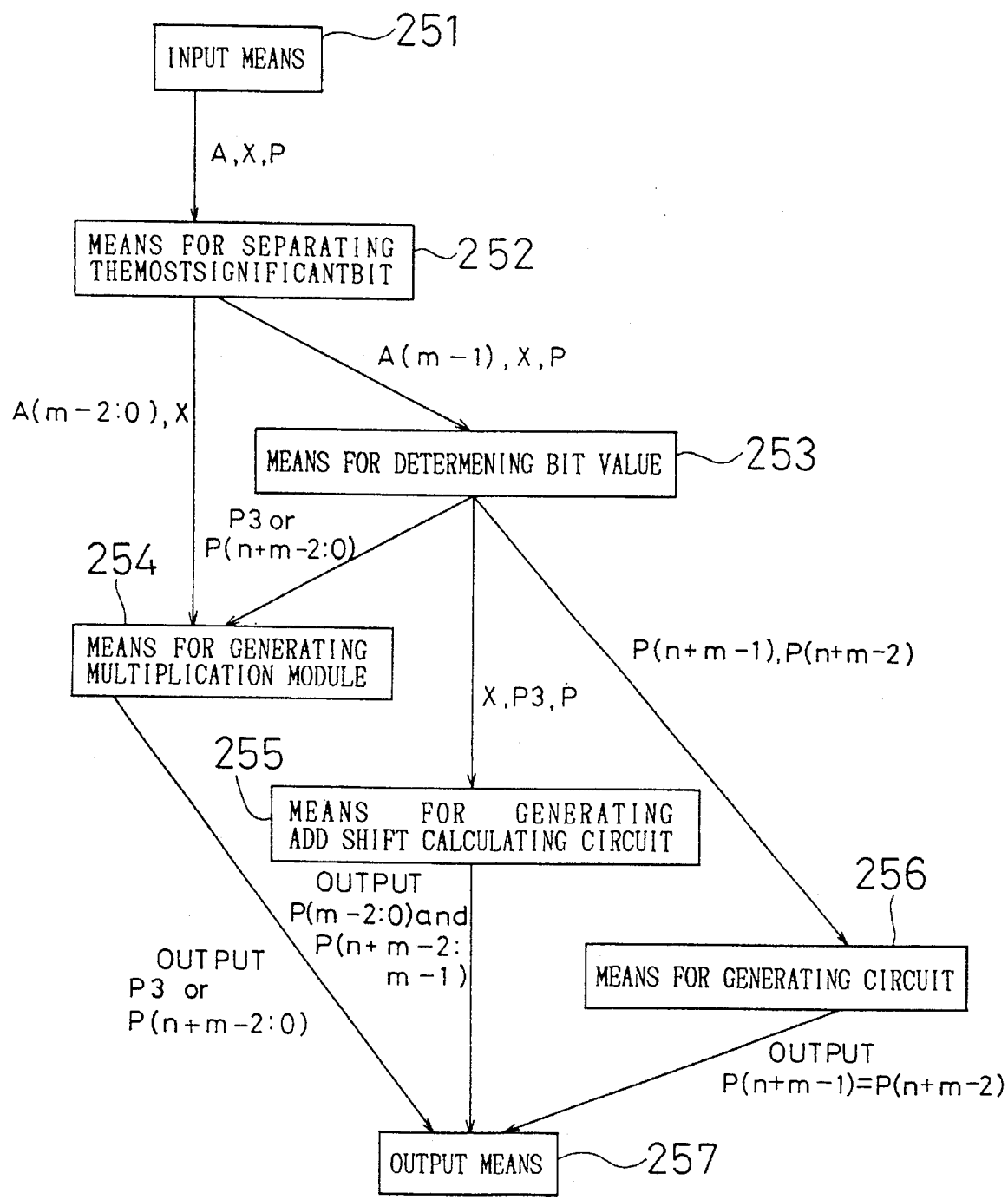
FIG. 18 is a block diagram showing the structure for performing the process of Step 144 of FIG. 12 in terms of its function.

FIG. 18 is a view showing the structure for performing the process of above Step 144 in terms of its function.

In the drawing, an input means 251 reads the circuit information on the initial multiplier 151 as an functional element out of the circuit data storage unit 23 and outputs, to a means 252 for separating the most significant bit, information which shows that the inputs to the multiplier 151 are the m-bit multiplier factor A and the n-bit multiplicand X and that the output from the multiplier 151 is the product P having the bit width of (m+n).

The means 252 for separating the most significant bit separates the most significant bit A (m−1) of the multiplier factor A from the low-order bits A (m−2:0) thereof and outputs, to a means 253 for determining bit value, information on the most significant bit A (m−1), multiplicand X, and product P, while outputting, to a means 254 for generating multiplication module, information on the lower bits A (m−2:0) and multiplicand X.

The means 253 for determining bit value determines whether the value of the most significant bit A (m−1) is 1 or 0 and outputs, to the means 254 for generating multiplication module, the information showing that the result of multiplying the multiplicand X by the low-order bits A (m−2:0) is the partial product P3 or the product P (n+m−2:0), depending on the result of determination. If the value of the most significant bit A (m−1) is 1, information on the multiplicand X, product P, and partial product P3 is outputted to a means 255 for generating add shift calculating circuit. Conversely, if the value of the most significant bit A (m−1) is 0, information on the most significant bit P (n+m−1) of the product P and information on the value P (n+m−2) is outputted to a means 256 for generating circuit.

The means 254 for generating multiplication module generates information on the multipliers 152 and 155 which multiply the multiplicand X by the low-order bits A (m−2:0) of the multiplier factor A so as to output the result as the partial product P3 or product P (n+m−2:0), and outputs the resulting information to an output means 257.

The means 255 for generating add shift calculating circuit generates information on a circuit consisting of the ripper 153 and adder 154, which outputs, in the case where the value of the most significant bit A (m−1) of the multiplier factor A is 1, the low-order (m−1) bits of the partial product P3 as the low-order (m−1) bits P (m−2:0) of the product P, while outputting the sum of the high-order n bits of the partial product P3 and multiplicand X as the high-order (n+1) bits P (n+m−1:m−1) of the product P, based on information on the partial product P3, information on the multiplicand X, and information on the product P. The resulting information is then outputted to the output means 257.

On the other hand, the means 256 for generating circuit generates information on a circuit, which outputs, in the case where the value of the most significant bit of the multiplier factor A is 0, the value P (n+m−2) as the most significant bit P (n+m−1) of the product P. The resulting information is outputted to the output means 257.

The output means 257 stores in the circuit data storage unit 23 the sets of circuit information on the circuit obtained by conversion, which are outputted from the respective means 254 to 256.

If it is determined in above Step 143 that the posibits (A) in the constant multiplier factor A is more than 2, the process goes on to Step 145, where it is further determined whether or not the posibits (A) is larger than the negabits (A)+1. The negabits (A) indicates the number of bits having the value of 0.

Figure 13:
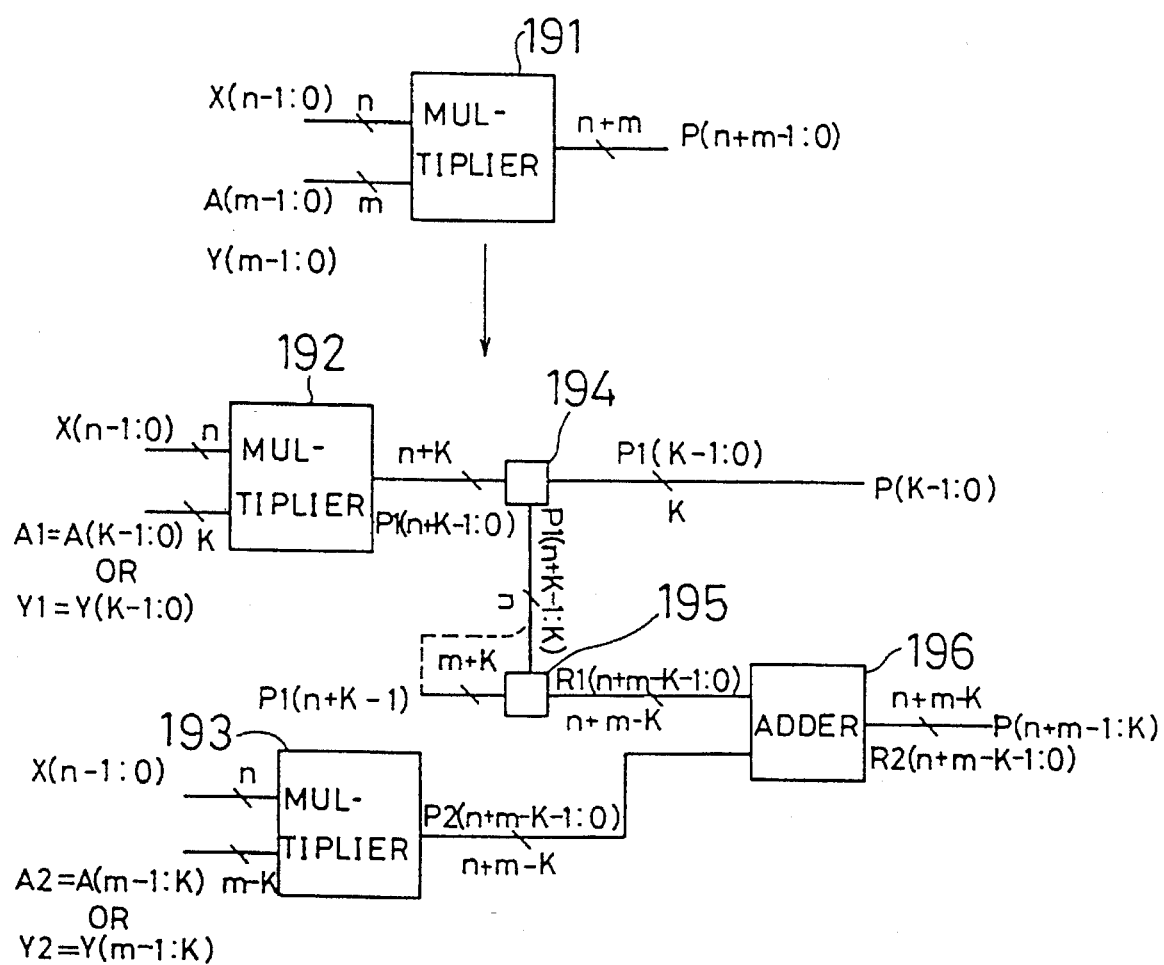
FIG. 13 is a view showing conversion rule 2.

In Step 145, if it is determined that the posibits (A) is not larger than the negabits (A)+1, the process goes on to Step 146. In Step 146, the conversion rule 2 shown in FIG. 13 is applied, similarly to the case of above Step 142 where the multiplier factor is a variable, so as to divide the multiplier factor A and conversion is made to a circuit including two multipliers. However, unlike the case where the multiplier factor is a variable, the value of K for dividing the multiplier factor A used here is not about ½ of the bit width of the multiplier factor A. Instead, the value of effbitwidth (A, L) is used. The effbitwidth (A, L) is defined as a value obtained by calculating the number of bits having the value of 1 from the least significant bit of the multiplier factor A till it becomes L, if L is the minimum integer equal to or more than the posibits (A)/2. The value of above L may be the maximum integer equal to or less than the posibits (A)/2 or a number obtained by raising 2 to a certain power which is close to the maximum integer, similarly to the value of above K.

Figure 8:
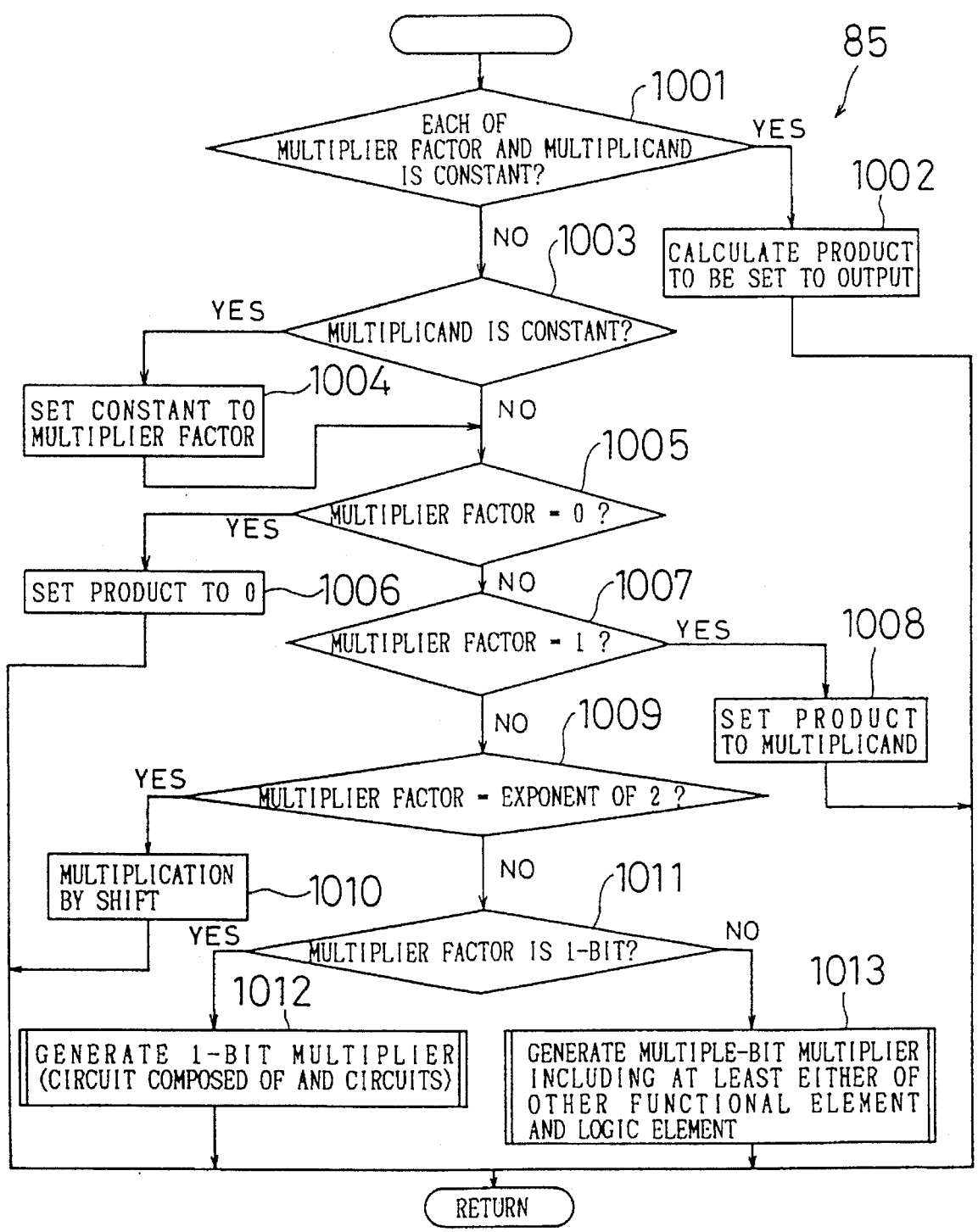
FIG. 8 is a flow chart showing the process of generating multiplier of Step 85 of FIG. 6 in detail.
Figure 9A:
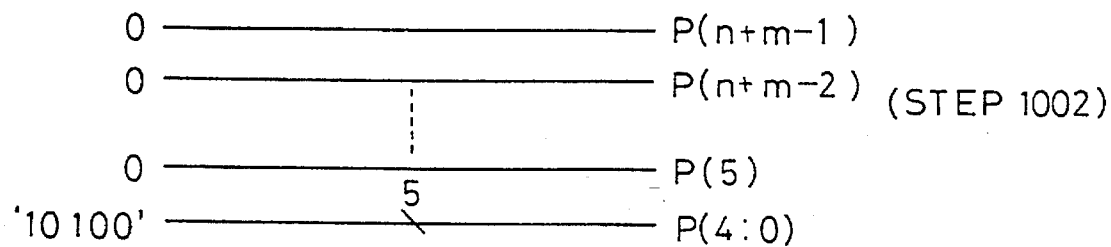
FIGS. 9(a) to 9(d) are circuit diagrams showing circuits generated in Steps 1002, 1006, 1008, and 1010 of FIG. 8, respectively.
Figure 9B:
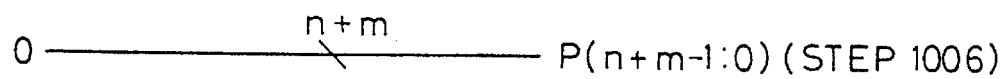
Figure 9C:
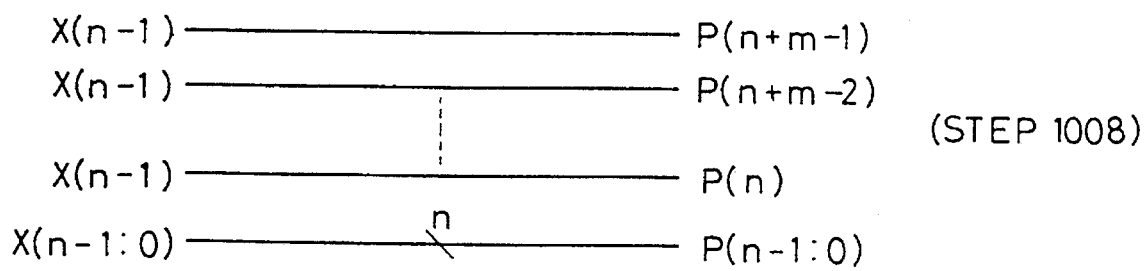
Figure 9D:
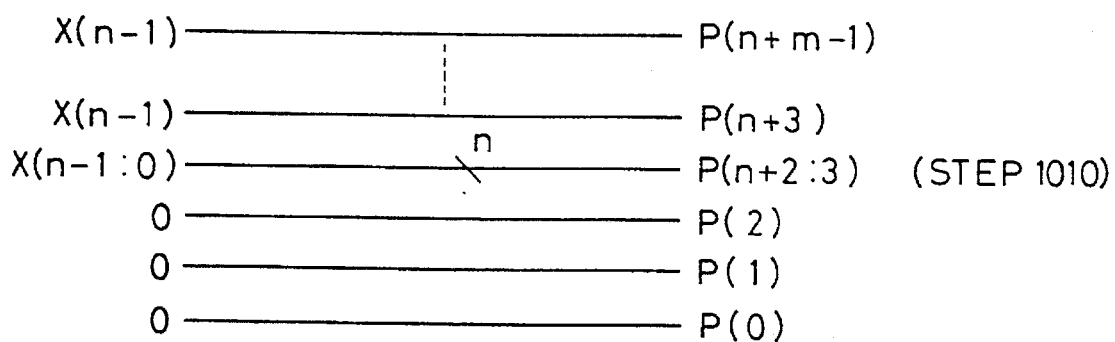

In the multiplier in which the multiplier factor A is divided and the posibits (A) becomes 2 or less by repeatedly performing the process of Step 146 once, twice, or more than twice, a circuit for calculating partial products only with respect to the bits having the value of 1 is produced in Step 1006 of FIG. 8 or in Step 144 of FIG. 12, as described above. By dividing the multiplier factor so that the numbers of bits having the value of 0 becomes substantially equal, the number of logic stages in the case of constituting a circuit for calculating the sum of partial products by connecting the adder so as to form a well-balanced binary tree can be reduced.

If the posibits (A) is 3, the number of logic stages always becomes 2 no matter how the multiplier factor A is divided. Therefore, it is also possible to determine whether or not the posibits (A) is 3 or less in Step 143, and to divide the multiplier factor A into the most significant 1 bit and the low-order (m−1) bits in Step 144, if the posibits (A) is 3.

The structure for performing the process of above Step 146 is the same as the structure of FIG. 14 corresponding to above Step 142, except that the manners to determine the value of K for dividing the multiplier factor A are different.

Figure 19:
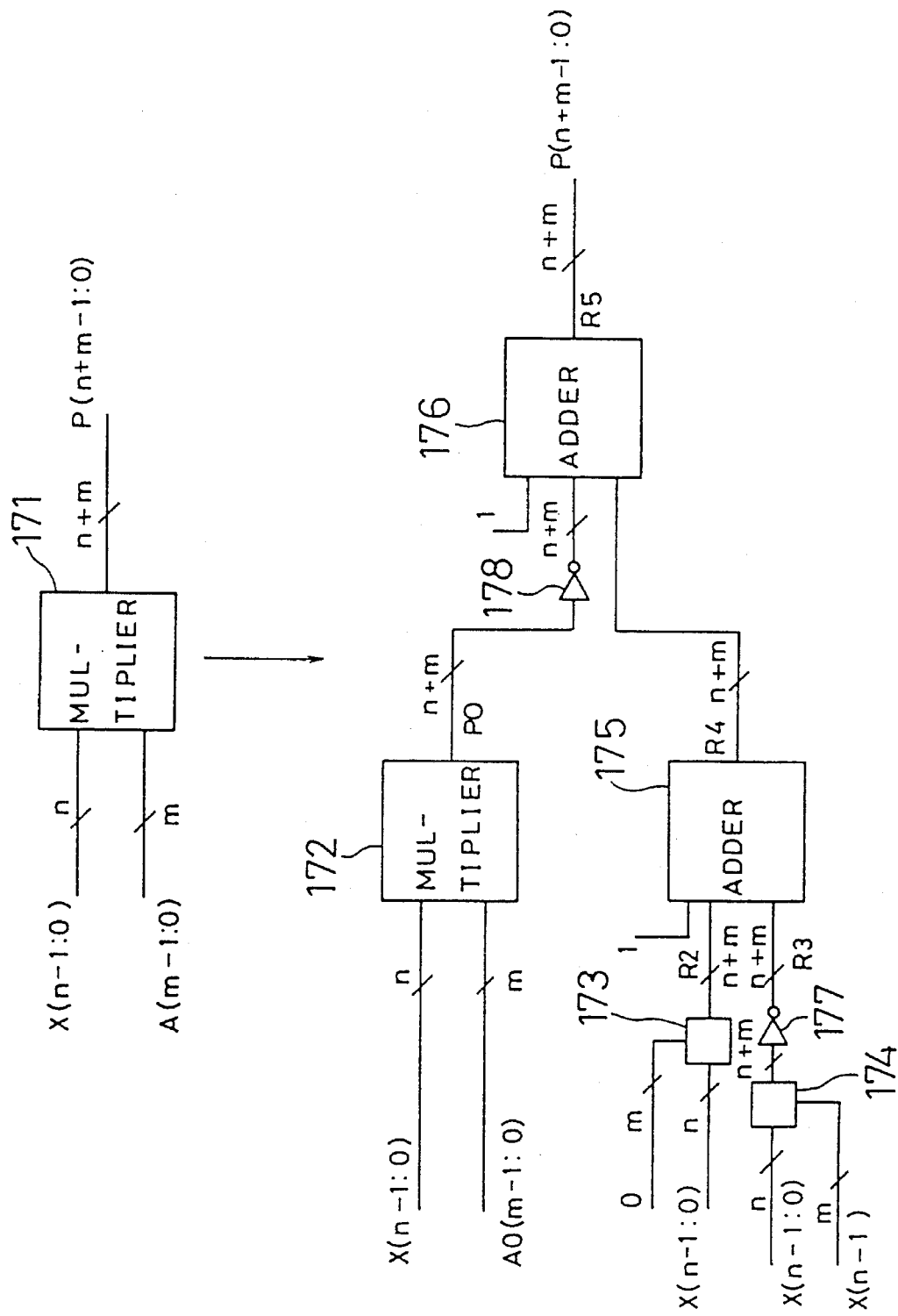
FIG. 19 is a view showing conversion rule 4.

Conversely, if it is determined that the posibits (A) is larger than the negabits (A)+1 in Step 145, the process proceeds to Step 147, where conversion rule 4 shown in FIG. 19 is applied so that conversion is made to a circuit including a multiplier for obtaining the product of a multiplier factor A0, which is obtained by inverting all the bits in the multiplier factor A by the logic NOT operation, and the multiplicand X. In the multiplier included in the circuit after conversion, the value of the posibits (A) and the value of the negabits (A) are switched, so that in the process of the next loop, the answer obtained in Step 145, for example, becomes "no", resulting in conversion whereby the multiplier A0 is divided in Step 146. Consequently, the circuit for obtaining partial products only with respect to the bits having the value of 0 is produced while the number of bits having the value of 1 is reduced compared with that of the multiplier factor A, so that the number of circuits for calculating the partial products and the number of logic stages in the circuits for calculating the sum of the partial products are reduced.

In order to obtain the product of the multiplier factor A and the multiplicand X, however, it is necessary to correct the product of the multiplier factor A0 and the multiplicand X. According to the foregoing conversion rule 4, conversion is made to a circuit which also includes a circuit for correction.

In FIG. 19, numeral 171 denotes a multiplier prior to conversion.

A multiplier 172 multiplies the multiplicand X by the foregoing multiplier factor A0 and outputs a product P0 (=X*A0) having the bit width (n+m).

An inverter 178 inverts all the bits in the product P0 by the logic NOT operation and outputs a signal having the bit width of (n+m).

The mixer 173 gathers a signal by using the multiplicand X as its high-order n bits and an m-bit signal having the value of 0 as its low-order m bits, so as to output the resulting signal R2 (=X*$2^m$) having the bit width of (n+m).

The mixer 174 gathers a signal by using an m-bit signal in which each bit has the value X (n−1), which is the value of the most significant bit of the multiplicand X as its high-order m bits and the logic NOT number of the foregoing multiplicand X as its low-order n bits, so as to outputs the resulting signal having the bit width of (n+m).

An inverter 177 inverts all the bits in an output from the mixer 174 by the logic NOT operation and outputs a signal R3 (=−X−1) having the bit width of (n+m).

An adder 175 receives the signal R2, signal R3, and a carry having the value of 1 as its inputs, and outputs their sum R4 (=X*($2^m$−1)) having the bit width of (n+m).

An adder 176 receives the logic NOT number of the product P0, the sum R4, and a carry having the value of 1 as its inputs, and outputs their sum R5 (=X*($2^m$−1)−P0) having the bit width of (n+m) as the product P.

The requirement on determination in above Step 145 is not limited to: posibits (A)>negabits (A)+1. It can be: posibits (A)≧m/2 or the like. In consideration of the sizes of the individual circuits for the foregoing correction, it is also possible for the process to go on to Step 147 only when the value of posibits (A) is larger.

Figure 20:
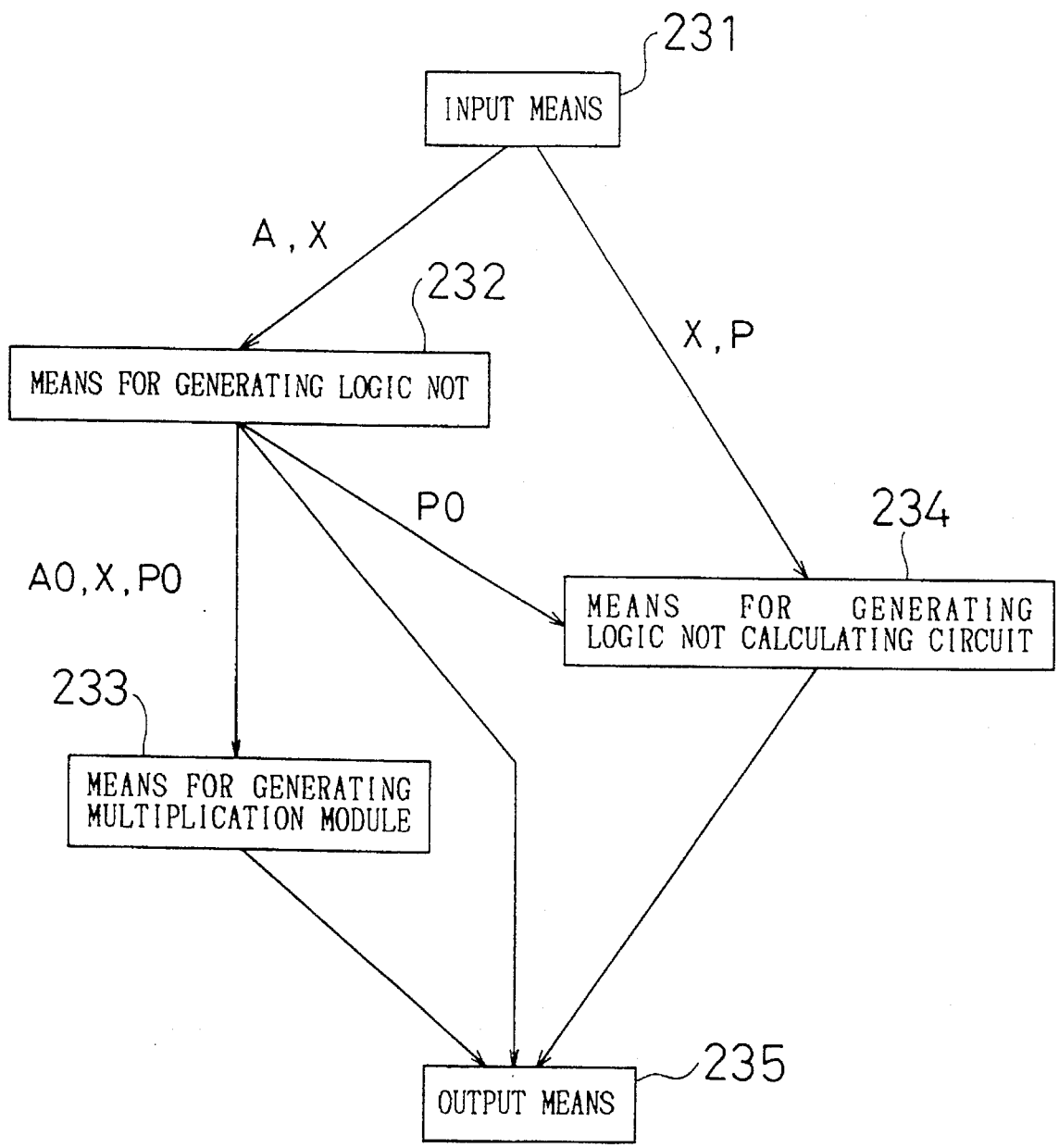
FIG. 20 is a block diagram showing the structure for performing the process of Step 147 of FIG. 12 in terms of its function.

FIG. 20 is a view showing the structure for performing the process of above Step 147 in terms of its function.

An input means 231 reads circuit information on the initial multiplier 171 as a functional element out of the circuit data storage unit 23 and outputs, to a means 232 for generating logic NOT, information which shows that the inputs to the multiplier 171 is the m-bit multiplier factor A and n-bit multiplicand X. The input means also outputs, to a means 234 for generating logic NOT calculating circuit, information on the foregoing multiplicand X and information which shows that the output from the multiplier 171 is the product P having the bit width of (m+m).

The means 232 for generating logic NOT outputs, to a means 233 for generating multiplication module, information on an inverter 179 for outputting the multiplier factor A0 by inverting all the bits in the multiplier factor A by the logic NOT operation, information on the foregoing multiplier factor A0, information on the multiplicand X, and information which shows that the result of multiplying the multiplicand X by the multiplier factor A0 is a product P0. The means for generating logic NOT also outputs, to the means 234 for generating logic NOT calculating circuit, information on the foregoing product P0.

The means 233 for generating multiplication module generates information on a multiplier 172 for calculating the product P0 of the multiplier factor A0 and multiplicand X and outputs it to an output means 235.

The logic NOT calculating circuit generating means 234 generates information on the circuits 173 and 138 which output the product P0 by providing a signal R5 (=X*($2^m$−1)−P0), based on the foregoing product P0 and multiplicand X, by subtracting the product P0 from a product R4 (=X*($2^m$−1)) of the multiplicand X and ($2^m$−1), and outputs it to the output means 235.

The output means 235 stores in the circuit data storage unit 23 circuit information on the circuit after conversion, which was outputted from the means 232 to 234.

Below, it will be proved by numerical expressions that the initial multiplier can be converted to an equivalent circuit in accordance with the foregoing conversion rules 1 to 4.

Conversion Rule 1 (see FIGS. 10(*a*), 10(*b*), and 10(*c*))

In FIG. 10(*b*), numeral 132 denotes an AND circuit for calculating a logic product P(n−1) of a 1-bit multiplicand X(n−1) and a 1-bit variable multiplier factor Y(0), numeral 133 denotes an AND circuit for calculating a logic product P(n−2) of a 1-bit multiplicand X(n−2) and a 1-bit variable multiplier factor Y(0), . . . numeral 134 denotes an AND circuit for calculating a logic product P(1) of a 1-bit multiplicand X(1) and a 1-bit variable multiplier factor Y(0), and numeral 135 denotes an AND circuit for calculating logic product P(0) of a 1-bit multiplicand X(0) and a 1-bit variable multiplier factor Y(0). Since Y(0)=0 or 1, $$P = \sum_{i=1}^{n-1} \{X(i) * Y(0) * 2^{i-1}\}$$

Here, since each of Y(0) and P(i) is composed of 1 bit, X(i)*Y(0)=X(i) and Y(0).
Therefore, $$P(i) = X(i) \text{ and } Y(0) \quad (0 \leq i \leq n-1)$$
$$P(n) = P(n-1)$$

Conversion rule 2 (see FIG. 13)

$$\begin{aligned}
P &= X * Y \\
&= X * Y(m-1:0) \\
&= X * \{Y(m-1:K) * 2^K + Y(K-1:0)\} \\
&= X * Y(m-1:K) * 2^K + X * Y(K-1:0) \\
&= P2(n+m-K-1:0) * 2^K + \\
&\quad P1(n+K-1:0) \\
&= P2(n+m-K-1:0) * 2^K + \\
&\quad P1(n+K-1:K) * 2^K + P1(K-1:0) \\
&= P2(n+m-K-1:0) * 2^K + \\
&\quad R1(n+m-K-1:0) * 2^K + P1(K-1:0) \\
&\ldots [\text{where } R1(n+m-K-1:n) = 0, \\
&\quad R1(n-1:0) = P1(n+K-1:K)] \\
&= \{P2(n+m-K-1:0) + \\
&\quad R1(n+m-K-1:0)\} * 2^K + P1(K-1:0) \\
&= R2(n+m-K-1:0) * 2^K + P1(K-1:0).
\end{aligned}$$

Hence, $$P(K-1:0) = P1(K-1:0)$$

$$P(n+m-1:K) = R2(n+m-K-1:0).$$

The same result was obtained when the multiplier factor A is a constant.

Conversion Rule 3(a) (see FIG. 16(a))

$$\begin{aligned}
P &= X * A \\
&= X * A(m-1:0) \\
&= X * \{A(m-1) * 2^{m-1} + A(m-2:0)\} \\
&= X * A(m-1) * 2^{m-1} + X * A(m-2:0) \\
&= X * 2^{m-1} + P3(n+m-2:0) \\
&\ldots [\text{because } A(m-1) = 1] \\
&= X * 2^{m-1} + P3(n+m-2:m-1) * 2^{m-1} + \\
&\quad P3(m-2:0) \\
&= R1(n:0) * 2^{m-1} + P3(m-2:0).
\end{aligned}$$

Hence,

P (m−2:0)=P3 (m−2:0)

P (n+m−1:m−1)=R1 (n:0)

Conversion Rule 3(b) (see FIG. 16(b))

$$\begin{aligned}
P &= X * A \\
&= X * A(m-1:0) \\
&= X * \{A(m-1) * 2^{m-1} + A(m-2:0)\} \\
&= X * A(m-2:0) \\
&\ldots [\text{because } A(m-1) = 0] \\
&= P3(n+m-2:0)
\end{aligned}$$

Hence,

P (n+m−2:0)=P3 (n+m−2:0)

P (n+m−1)=P (n+m−2)

Conversion Rule 4 (see FIG. 19))

Below, the logic NOT number obtained by inverting all the bits in a multiple-bit number Z by the logic NOT operation will be represented by #Z.
For the constant A, $$-A = \#A + 1 - 2^m \leftarrow \rightarrow \#A + 1 = 2^m - A.$$

For an n-bit number X, (two's complement of X)=#X+1=−X.

Therefore, $$\begin{aligned}
P &= X * A \\
&= X * (2^m - \#A - 1) \\
&= X * 2^m - X - X * \#A \\
&= X * 2^m + (\text{two's complement of } X) + \\
&\quad (\text{two's complement of } X * \#A) \\
X1 &= X * 2^m + (\text{two's complement of } X), \\
P0 &= X * A.
\end{aligned}$$

Hence, $$\begin{aligned}
X * A &= X1 + (\text{two's complement of } P0) \\
&= X * 2^m + (\text{two's complement of } X) + \\
&\quad (\text{two's complement of } P0).
\end{aligned}$$

Hence, $$X*A = X*2^m + \#X + 1 + \#P0 + 1$$

The first term $X*2^m$ of the foregoing equation can be obtained as R2 by the mixer 173.

The second term X can be obtained as R3 by the mixer 174 and inverter 177 through sign extension and inversion of all the bits by the logic NOT operation.

The fourth term P0 can be obtained by the multiplier 172 and inverter 178.

The addition of the first term $X*2^m$, second term X, and 1 as the third term or fifth term can be performed by the adder 175, thus providing the sum R4. Since X*A is a number having the bit width of (n+m), it is not necessary to consider the (n+m+1)-th bit position in the addition result.

The addition of said R4, the fourth term P0, and 1 as the third term or fifth term can be performed by the adder 176, thus providing the sum R5. Since X*A is a number having the bit width of (n+m), it is not necessary to consider the (n+m+1)-th bit position in the addition result.

Hence, $$\begin{aligned}
P &= X * A \\
&= P(n+m-1:0) \\
&= R5(n+m-1:0)
\end{aligned}$$

As described above, with the system for automatically designing logic circuits of the first embodiment, if the multiplier factor inputted to the multiplier is a constant and if the total number of bits having the value of 1 is 3 or more, the multiplier factor is divided into two parts so that each part includes the equal number of bits having the value of 1. Consequently, the circuit for calculating the sum of the partial products is structured in a well-balanced binary tree, and it becomes possible to reduce the number of logic stages and provide higher-speed multiplication.

If the total number of the bits having the value of 1 is 2 or less, a circuit for calculating partial products only with respect to the bits having the value of 1 is constituted, thereby reducing the number of partial products and circuit area.

When the total number of the bits having the value of 1 is large, a multiplier for multiplying the multiplicand by the logic NOT number of the multiplier factor and a circuit for correcting the multiplication result are constituted, thereby reducing the number of partial products and circuit area.

EXAMPLE 2

A variation of the structure for performing the same process as that of Step 1013 of FIG. 8, i.e., the process of Steps 141 through 147 of FIG. 12 will be described with reference to FIG. 21.

Figure 21:
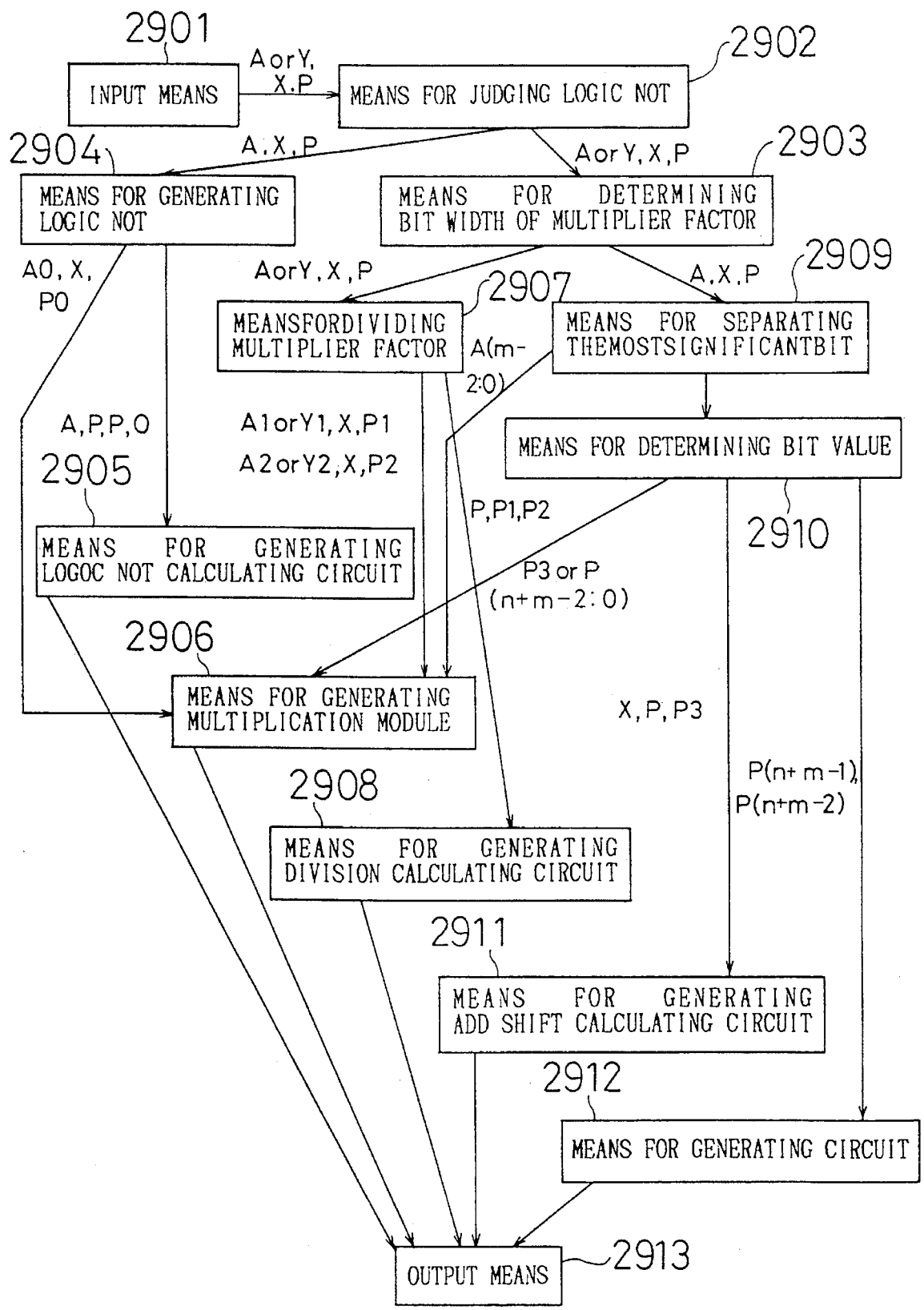
FIG. 21 is a block diagram showing a variation of the structure for performing the same process sequence as that of Steps 141 through 147 shown in FIG. 12 according to the first embodiment of the present invention.

In FIG. 21, an input means 2901 reads circuit information on the initial multiplier as functional element out of the circuit data storage unit 23 and outputs, to a means 2902 for judging logic NOT 2902, information which shows that the inputs to the multiplier are the m-bit multiplier factor A or Y and the n-bit multiplicand X and that the output from the multiplier is the product P having the bit width of (m+n).

The means 2902 for judging logic NOT judges whether or not the posibits (A) is larger than the negabits (A)+1. If the answer is yes, information on the multiplier factor A or Y, multiplicand X, and product P is outputted to a means 2904 for generating logic NOT. Conversely, if the answer is no, the foregoing information is outputted to a means 2903 for determining the bit width of multiplier factor.

The means 2903 for determining the bit width of multiplier factor determines whether or not the multiplier factor is a variable, whether or not the multiplier factor is a constant and the posibits (A) is 3 or more, or whether or not the multiplier factor is a constant and the posibits (A) is 2 or less.

When the multiplier factor is a variable or when the multiplier factor is a constant and the posibits (A) is 3 or more, the information on the multiplier factor A or Y, multiplicand X, and product P is outputted to a means 2907 for dividing multiplier factor. On the other hand, if the multiplier factor is a constant and the posibits (A) is 2 or less, the information on the multiplier factor A or Y, multiplicand X, and product P is outputted to a means 2909 for separating the most significant bit of multiplier.

Other means 2904 to 2913 have the same functions as those of the means shown in FIGS. 14, 18, and 20, except that their information transfer path is slightly different, so that the description thereof will be omitted.

EXAMPLE 3

Figure 22:
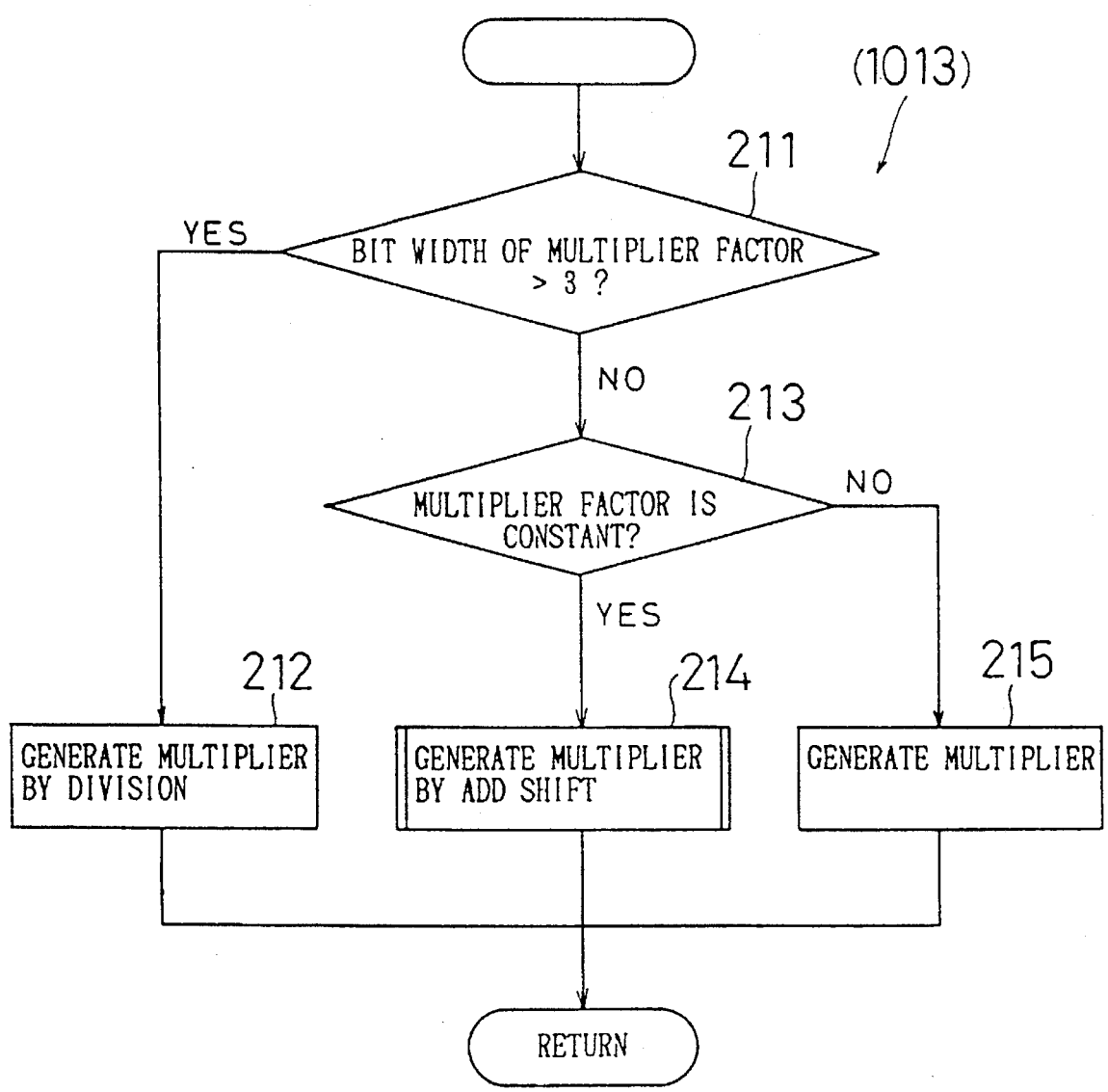
FIG. 22 is a flow chart showing another example, in the third embodiment of the present invention, of the process of generating multiple bit multiplier performed in Step 1013 of the first embodiment which is shown in FIG. 8.

Another example of the process performed in Step 1013 of FIG. 8 in the first embodiment will be described with reference to FIG. 22.

In the present embodiment, if the bit width of the multiplier factor is 3 or more, the multiplier factor is divided into two parts so that each part has the bit width of about ½, whether the multiplier factor is a constant or variable. If the bit width of the multiplier factor is 2 and if the multiplier factor is a constant, the foregoing conversion rule 3 (see FIGS. 16(a) and 16(b)) is applied, so that conversion is made to a circuit for calculating partial products only with respect to the bits having the value of 1. On the other hand, if the multiplier factor is a variable, a circuit including two multipliers which use a 1-bit multiplier factor is constituted.

In Step 211, it is determined whether the bit width of the multiplier factor is 3 or more. If it is 3 or more, the process goes on to Step 212, where the foregoing conversion rule 2 (see FIG. 13) is applied so that conversion is made to a circuit including two multipliers in which the bit width of the multiplier factor is about ½.

If the bit width of the multiplier factor is less than 3, the process goes on to Step 213, where it is determined whether or not the multiplier factor is a constant. If it is a constant, the process goes on to Step 214, where the foregoing conversion rule 3 (see FIGS. 16(a) and 16(b)) is applied so that conversion is made to a circuit for calculating partial products only with respect to the bits having the value of 1 in the multiplier factor.

Figure 23:
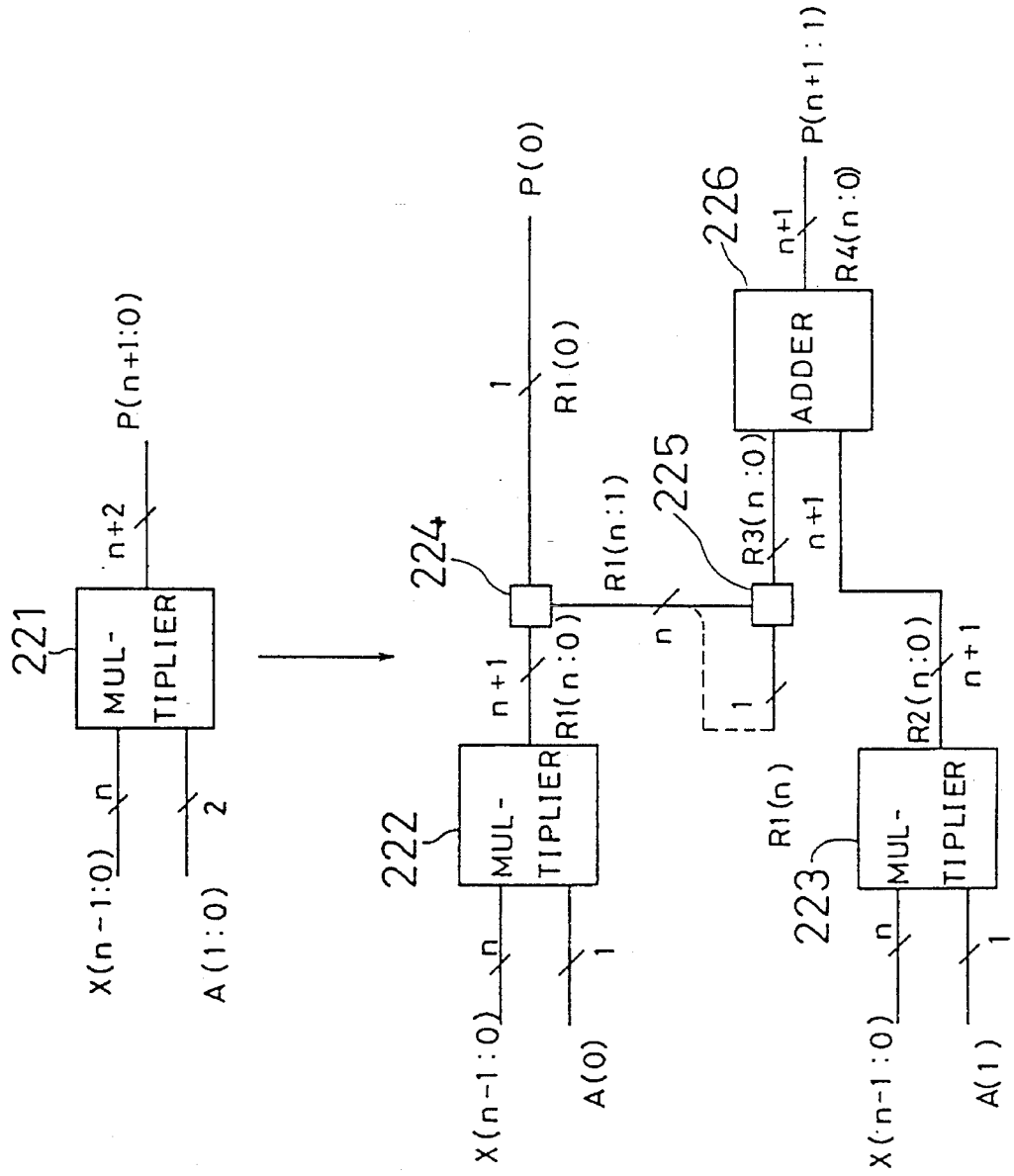
FIG. 23 is a view showing conversion rule 5.

Conversely, if the multiplier factor is a variable, the process goes on to Step 215, where conversion rule 5 shown in FIG. 23 is applied.

The conversion rule 5 shows that a multiplier 221 is converted to a circuit consisting of multipliers 222 and 223, ripper 224, mixer 225, and adder 226.

The foregoing multiplier 222 multiplies the multiplicand X(n−1:0) by the low-order 1 bit A(0) of the multiplier factor A (1:0), so as to calculate the partial product R1(n:0) having the bit width of (n+1).

The multiplier 223 multiplies the multiplicand X(n−1:0) by the high-order 1 bit A(1) of the multiplier factor A (1:0), so as to calculate the partial product R2 (n+1:1) having the bit width of (n+1).

The ripper 224 divides the partial product R1(n:0) into the high-order n bits R1(n:1) and the low-order 1 bit R(0), so as to output R(0) as the product P(0).

The mixer 225 outputs a signal R3(n+1:1) which is obtained by extending the sign of above R1(n:1) by 1 bit to the higher order.

The adder 226 adds the signal R3(n+1:1) and partial product R2(n+1:1) so as to output the sum R4(n+1:1) as the product P(n+1:1).

Below, it will be proved that the initial multiplier 221 can be converted to an equivalent circuit according to the foregoing conversion rule 5.

$$\begin{aligned}
P &= X * A \\
  &= X * A\,(1:0) \\
  &= X * \{A\,(1) * 2 + A\,(0)\} \\
  &= X * A\,(1) * 2 + X * A\,(0) \\
  &= R2\,(n:0) * 2 + R1\,(n:0) \\
  &= R2\,(n:0) * 2 + R1\,(n:1) * 2 + R1\,(0) \\
  &= R2\,(n:0) * 2 + R3\,(n:0) * 2 + R1\,(0) \\
  &\quad \ldots [\text{where } R3\,(n) = 0,\, R3\,(n-1:0) = R1\,(n:1)] \\
  &= R4\,(n:0) * 2 + R1\,(0).
\end{aligned}$$

Hence,

P(0)=R1(0)

P(n+1:1)=R4(n:0)

When the process is performed, the bit width of the multiplier factor in the multipliers 222 and 223 becomes 1 bit, so that conversion is made to a circuit consisting of AND circuits in the process of the next rule, according to the foregoing conversion rule 1 (see FIGS. 10(a), 10(b), and (c)).

According to the present embodiment 3, if the bit width of the multiplier factor in the multiplier is 3 or more, it becomes possible to structure the circuit for calculating partial products in a binary tree by dividing the multiplier factor, so that the number of logic stages in multiplication can be reduced and the speed of multiplication can be increased.

On the other hand, if the bit width of the multiplier factor is 2 or less and if the multiplier factor is a constant, it becomes possible to reduce the number of partial products and circuit area by generating the circuit for calculating partial products only with respect to the bits having the value of 1 in the multiplier factor.

EXAMPLE 4

Although Step 144 (see FIG. 12) of the foregoing first embodiment and Step 214 (see FIG. 22) of the third embodiment show an example in which the conversion rule 3 for separating the most significant bit of the multiplier factor A is applied to the 2-bit multiplier in which the posibits (A)=2, it is possible to apply conversion rule 6 for dividing the multiplier factor into three parts of a specified K-th bit, the high-order bits, and the low-order bit. It is also possible to apply the conversion rule 6 instead of the conversion rule 2 in Step 146 (see FIG. 12) or in Step 212 (see FIG. 22). In this case, the determination in Step 143 or Step 211 may be omitted.

Figure 24:
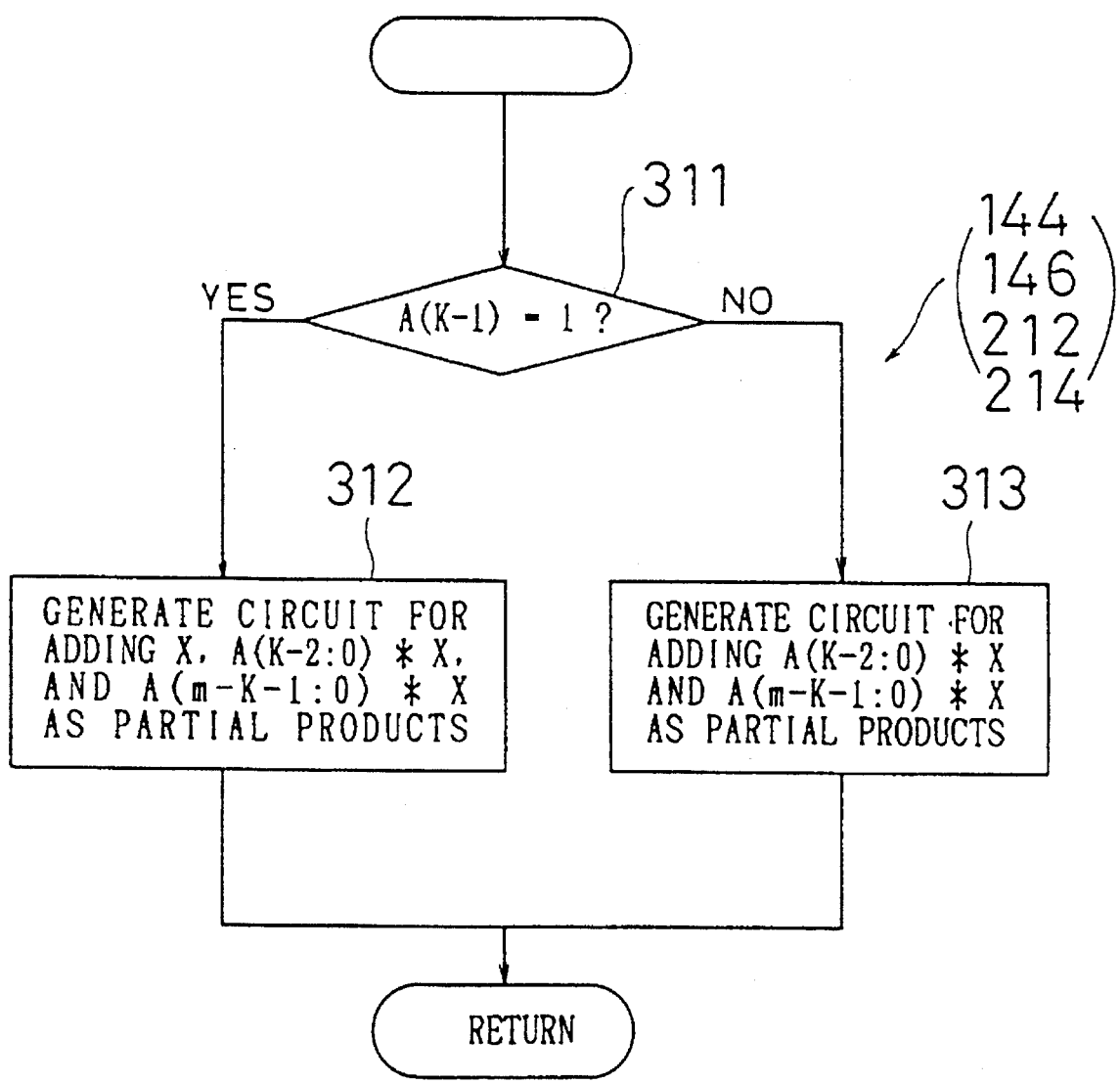
FIG. 24 is a flow chart showing another example, in the fourth embodiment of the present invention, of the process of generating add shift multiplier performed in Step 144 of the first embodiment which is shown in FIG. 12.
Figure 25A:
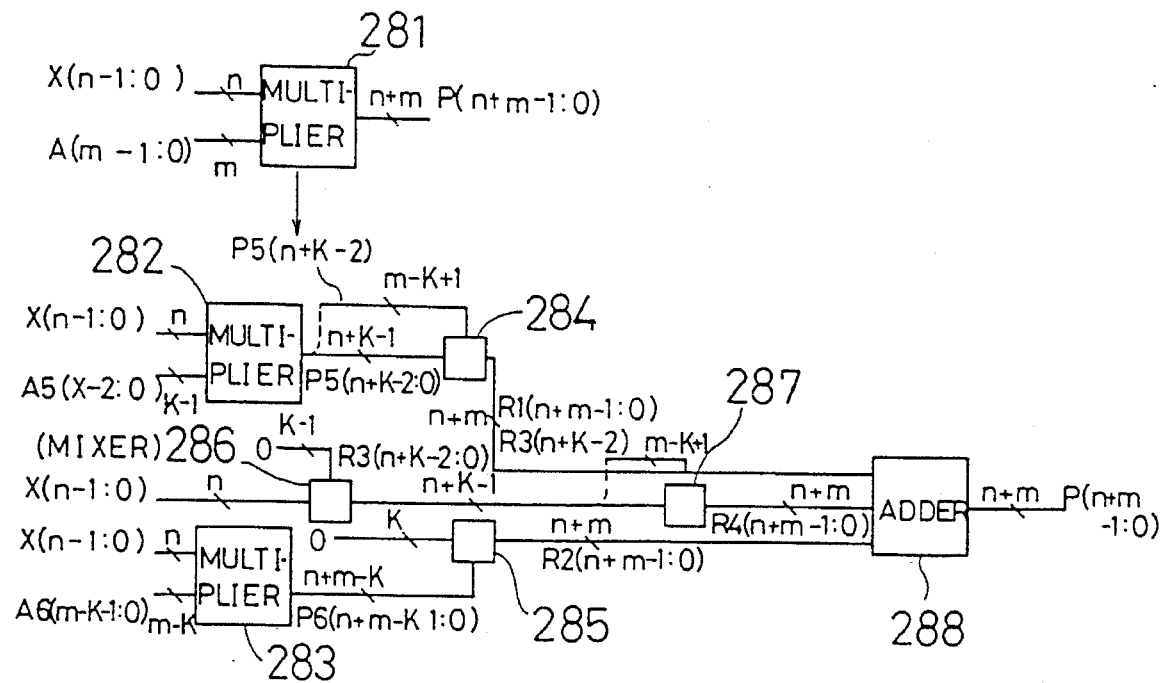
FIGS. 25(a) and 25(b) are views showing conversion rule with FIG. 25(a) illustrating, conversion rule 6(a) when A(K−1)=1, and FIG. 25(b) illustrating conversion rule 6(b) when A(K−1)–0.
Figure 25B:
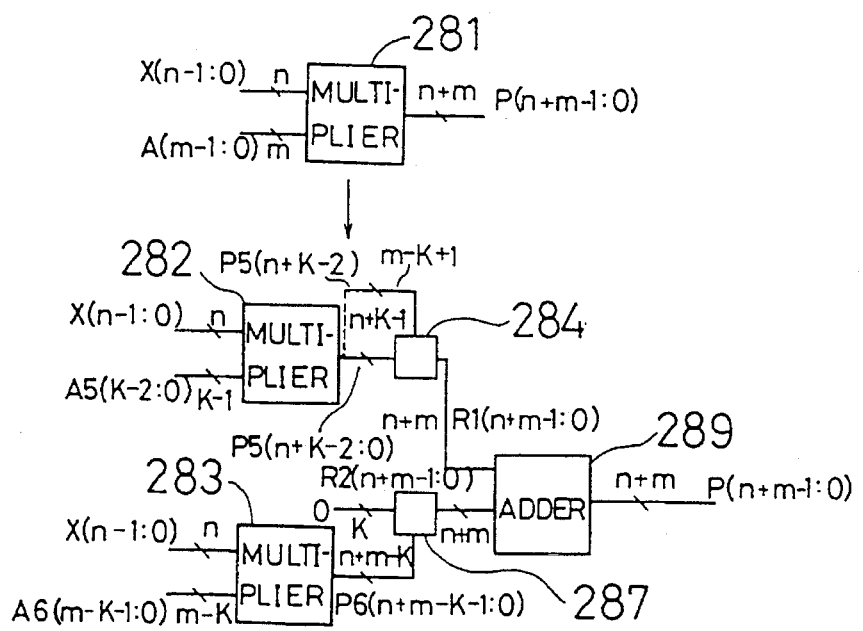

First, as shown in FIG. 24, it is determined whether or not the value of the K-th bit A(K−1) in the multiplier factor A is 1 in Step 311. If it is 1, the process goes on to Step 312, where conversion rule 6(a) shown in FIG. 25(a) is applied. On the other hand, if it is 0, the process goes on to Step 313, where conversion rule 6(b) shown in FIG. 25(b) is applied. The conversion rules 6(a) and 6(b) constitute the conversion rule 6. As for the value of above K, it can be set similarly to that of, e.g., the first embodiment.

The conversion rule 6(a) shows that a multiplier 281 is converted to a circuit consisting of multipliers 282 and 283, mixers 284 to 287, and adder 288.

The multiplier 282 multiplies the multiplicand X(n−1:0) by the low-order (K−1) bits A5(K−2:0)=A(K−2:0) in the multiplier factor A, so as to calculate the partial product P5(n+K−2:0) having the bit width of (n+K−1).

The multiplier 283 multiplies the multiplicand X(n−1:0) by the high-order (m−K) bits A6(m−K−1:0)=A(m−1:K) of the multiplier factor A, so as to calculate the partial product P6(n+m−K−1:0).

The mixer 284 outputs a signal R1(n+m−1:0) which is obtained by extending the sign of the partial product P5(n+K−2:0) by (m−K+1) bits to the higher order.

The mixer 285 outputs a signal R2(n+m−1:0) which is a K-bit signal having the value of 0 gathered in the lower order of the partial product P6.

The mixer 286 outputs a signal R3(n+K−2:0) which is obtained by gathering a signal having the value of 0 and the bit width of (K−1) in the lower order of the multiplicand X(n−1:0).

The mixer 287 outputs a signal R4(n+m−1:0) which is obtained by extending the sign of the foregoing signal R3(n+K−2:0) by (m−K+1) bits to the higher order.

The adder 288 adds the foregoing signal R1(n+m−1:0), signal R2(n+m−1:0), and signal R4(n+m−1:0) so as to output the product P(n+m−1:0).

The conversion rule 6(b) shows that the multiplier 281 is converted to a circuit consisting of the multipliers 282 and 283, mixers 284 and 287, and an adder 289.

The foregoing adders 282 and 283 and mixers 284 and 287 are the same as shown in the conversion rule 6(a). The adder 289 adds the signal R1(n+m−1:0) and signal R2(n+m−1:0) so as to output the product P(n+m−1:0).

Below, it will be proved that the initial multiplier 281 can be converted to an equivalent circuit according to the foregoing conversion rule 6.

Conversion Rule 6(a)

Since $A(K-1) = 1$, $$P = X * A$$
$$= X * \{A(m-1:K) * 2^K + A(K-1) * 2^{K-1} + A(K-2:0)\}$$
$$= X * A(m-1:K) * 2^K + X * 2^{K-1} + X * A(K-2:0)$$
$$= X * A6(m-K-1:0) * 2^K + X * 2^{K-1} + X * A5(K-2:0)$$
$$= P6(n+m-K-1:0) * 2^K + R3(n+K-2:0) * 2^{K-1} + P5(n+K-2:0)$$
$$= R2(n+m-1:0) * 2^K + R4(n+m-1:0) * 2^{K-1} + R1(n+m-1:0)$$

Conversion Rule 6(b)

Since $A(K-1) = 0$, $$P = X * A$$
$$= X * \{A(m-1:K) * 2^K + A(K-1) * 2^{K-1} + A(K-2:0)\}$$
$$= X * A(m-1:K) * 2^K + X * A(K-2:0)$$
$$= X * A6(m-K-1:0) * 2^K + X * A5(K-2:0)$$
$$= P6(n+m-K-1:0) * 2^K + P5(n+K-2:0)$$
$$= R2(n+m-1:0) * 2^K + R1(n+m-1:0)$$

EXAMPLE 5

Figure 26:
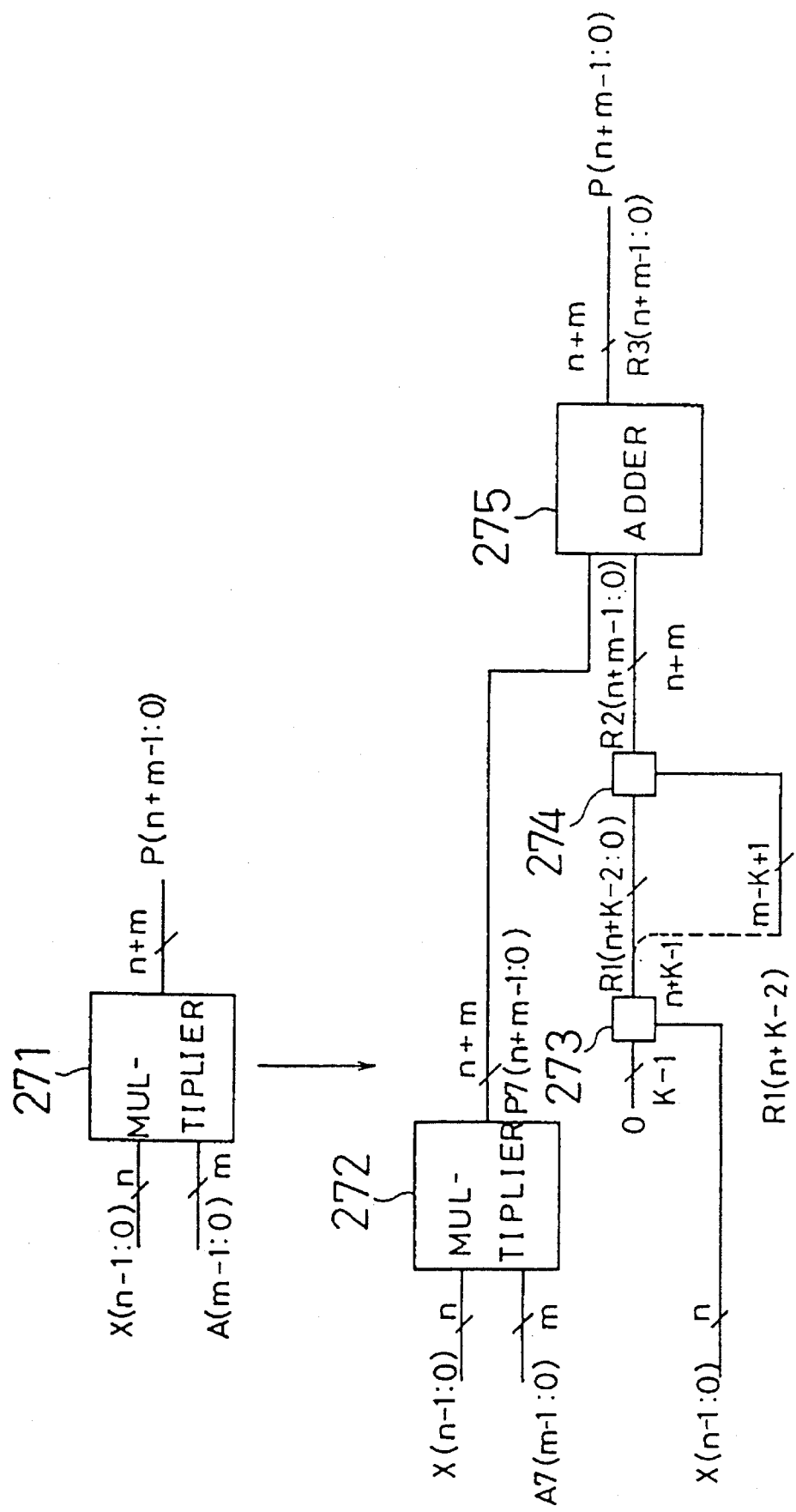
FIG. 26 is a view showing conversion rule 7 in the fifth embodiment of the present invention.

Although Step 144 (see FIG. 12) of the first embodiment and Step 214 of the third embodiment show an example in which the conversion rule 3 is applied to the 2-bit multiplier in which the posibits (A)=2 in the multiplier factor A, it is also possible to apply conversion rule 7 shown in FIG. 26 instead.

The conversion rule 7 shows that a multiplier 271 is converted to a circuit consisting of a multiplier 272, mixers 273 and 274, and adder 275.

The multiplier 272 multiplies the multiplicand X by an m-bit multiplier factor A7 (m−1:0) which is obtained by setting the K-th bit ($0 \leq K \leq m-1$) having the value of 1 in the multiplier factor A(m−1:0) to 0, so as to output the product P7(n+m−1:0).

The mixer 273 gathers a signal by using the multiplicand X as the high-order n bits and by using a signal having the value of 0 and the bit width of (K−1) as the low-order (K−1) bits and outputs the resultant signal R1(n+K−2:0) having the bit width of (n+K−1).

The mixer 274 gathers a signal having the bit width of (m−K+1) in which each bit has the value of R1(n+k−2) in the higher order of the foregoing signal R1(n+K−2:0) by extending the sign of the signal R1 and outputs the resulting signal R2(n+m−1:0) having the bit width of (n+m).

The adder 275 adds the product P7(n+m−1:0) and signal R2(n+m−1:0), so as to output the sum R3(n+m−1:0) as the product P(n+m−1:0).

Below, it will be proved that the initial multiplier 271 can be converted to an equivalent circuit according to the foregoing conversion rule 7.

Since $A7(m-1:0) = A(m-1:0) - 2^{K-1}$,

-continued $$P = X * A$$
$$= X * \{A7\,(m-1:0) + 2^{K-1}\}$$
$$= X * 2^K + X * A7\,(m-1:0)$$
$$= R1\,(n+K-2:0) + P7\,(n+m-1:0)$$
$$= R2\,(n+m-1:0) + P7\,(n+m-1:0)$$
$$= R3\,(n+m-1:0).$$

In this case, the bit width of the multiplier factor A7(m−1:0) inputted to the multiplier 272 is equal to the bit width of the multiplier factor A (m−1:0) inputted to the multiplier 271. However, since the number of the bits having the value of 1 is decreased, if the process is repeatedly performed, the process of above Step 1008 or Step 1010 (see FIG. 8) will eventually be implemented.

Figure 27:
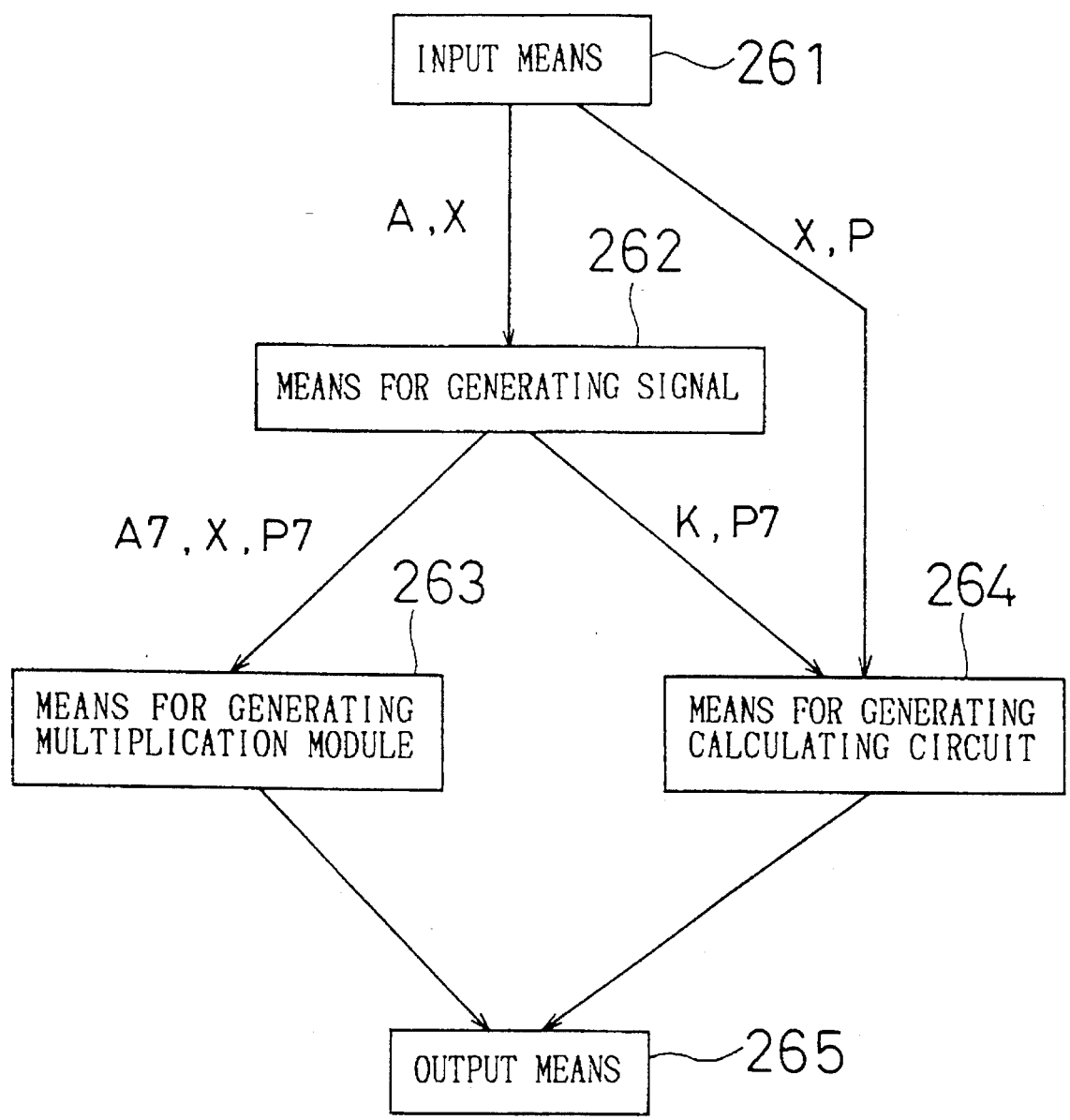
FIG. 27 is a block diagram showing the structure for performing the process according to the conversion rule 7 in terms of its function.

FIG. 27 is a view showing the structure for performing the foregoing conversion rule 7 in terms of its function.

An input means 261 reads circuit information on the initial multiplier as a functional element out of the circuit data storage unit 23 and outputs information, to a means 262 for generating signal, information which shows that the inputs to the multiplier 271 are the m-bit multiplier factor A and n-bit multiplicand X. The input means 261 also outputs, to a means 264 for generating calculating circuit, information on the multiplicand X and information which shows that the output from the multiplier 271 is the product P having the bit width of (m+n).

The means 262 for generating signal outputs, to a means 263 for generating calculation module, information on a multiplier factor A7 which is obtained by turning the K-th bit (0≦K≦m−1), having the value of 1, in the multiplier factor A to 0, information on the multiplicand X, and information which shows that the multiplication result is a product P7. The means 262 for generating signal also outputs information on the value of above K and information on the product P7 to the means 264 for generating calculating circuit.

The means 263 for generating calculation module generates information on the multiplier 272 for calculating the product P7 of the foregoing signal X and signal A7 and outputs the resulting information to an output means 265.

The means 264 for generating calculating circuit outputs, based on the information on the value of K, the information on the product P7, information on the multiplicand X, and information on the product P, information on mixers 276 and 274 and on a multiplier 275 to the output means 265.

The output means 265 stores in the circuit data storage unit 23 circuit information on the circuit obtained by conversion, which was outputted from the means 263 for generating multiplication module and from the means 264 for generating calculating circuit.

EXAMPLE 6

Other examples of the foregoing conversion rule 4 and the structures of multipliers which are generated in accordance with the examples will be described. Although the present embodiment shows the case in which the variable X is a positive number for simplicity, if the variable X can be a positive or negative number, it is possible to calculate the logic NOT number after sign extension, similarly to the conversion 4, or to perform sign extension after calculating the logic NOT number.

Figure 28A:
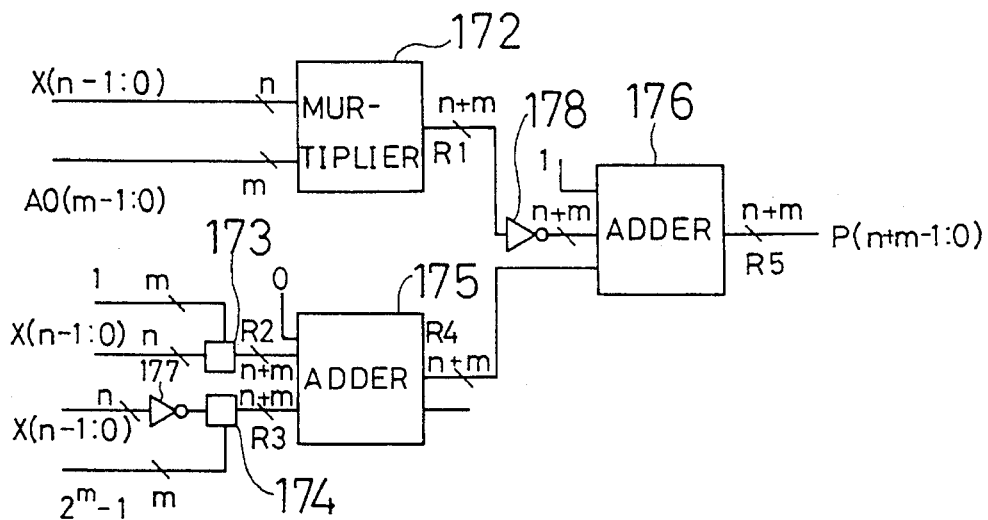
FIGS. 28(a) to 28(c) are views showing other examples of the conversion rule 4 in the sixth embodiment of the present invention and multipliers which are generated according to these conversion rules.
Figure 28B:
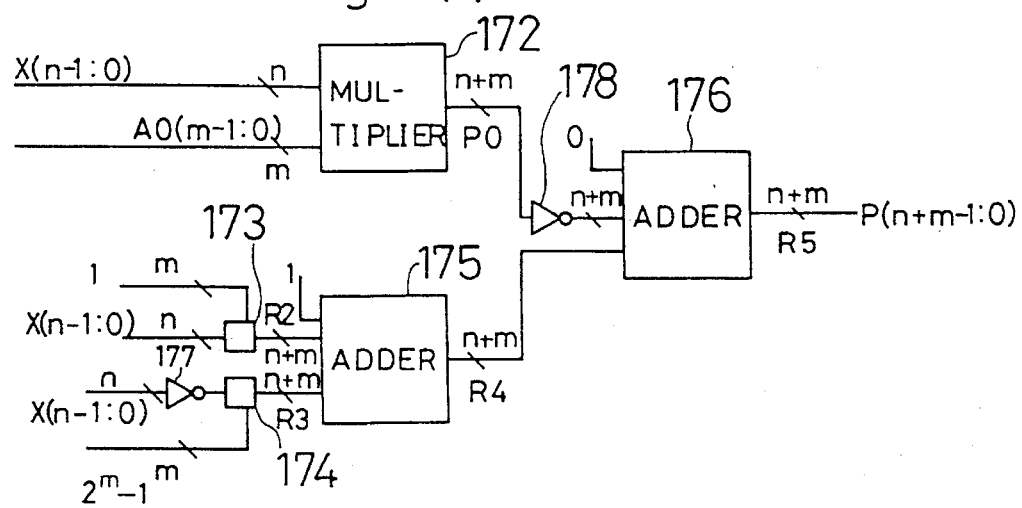
Figure 28C:
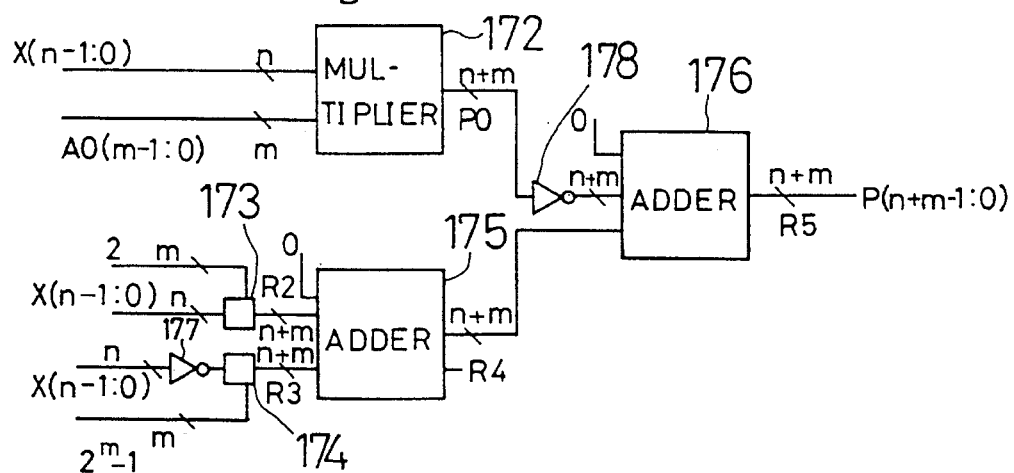

FIGS. 28(a) to 28(c) show the conclusion clauses of the conversion rules as well as the structures of multipliers generated. Since the components shown in FIGS. 28(a) to 28(c) are the same as shown in FIG. 19, the description thereof will be omitted by providing the same numerals.

In the multiplier of FIG. 28(a), a signal having the value of 1 is inputted to the mixer 173 as an m-bit signal instead of a signal having the value of 1 being inputted to the multiplier 175 as a carry.

In the multiplier of FIG. 28(b), a signal having the value of 1 is inputted to the mixer 173 as an m-bit signal instead of a signal having the value of 1 being inputted to the multiplier 176 as a carry.

If the bit width m of the multiplier factor is 2 or more, it is possible to input a signal having the value of 2 to the mixer 17 as an m-bit signal, instead of inputting a signal having the value of 1 as a carry, as shown in FIG. 28(c).

Thus, the calculation for obtaining the product P by correcting the product P0 can be modified in various manners.

In the foregoing multipliers, any multiplier included therein is designed to multiply the multiplicand X by the multiplier factor A0, which is the value obtained by inverting all the bits in the multiplier A by the logic NOT operation. Consequently, even when posibits (A) is larger than m/2, it is possible to reduce circuit area and increase the speed of multiplication by reducing the number of partial products to m/2 or less.

In each of the foregoing embodiments, circuit information stored in the circuit data storage unit 23 has been described in information representation which represents circuits in terms of functional elements, logic elements, and mounted elements, and more specifically, in terms of inputs and outputs to and from these elements. However, the present invention is not limited thereto, and it is also possible to perform a process of converting circuits in accordance with similar conversion rules, even if information representation based on the relationships among the elements, namely signals, is used instead.

The conversion process is not limited to the process of converting circuits in accordance with the foregoing conversion rules, either. The conversion process can be a process of sequentially generating and entering parts of circuit information in a specified order.

Although the foregoing embodiments have described the case in which the product P of the m-bit multiplier factor and n-bit multiplicand has the bit width of (n+m), it is easily attainable to more commonly calculate a product having a given bit width. For example, if the bit width l of the product P is less than (n+m), the low-order l bits of the multiplication result are used as the product P. Conversely, if the bit width l of the product P is more than (n+m), the multiplication result having the bit width of (n+m) is used as the low-order bits, while the high-order bits are subjected to sign extension, so as to provide the product P.

We claim:

1. A method of automatically designing a logic circuit for generating information on the logic circuit for calculating the product of a multiplier factor, which is a constant, and a multiplicand, comprising the steps of:

(a) inputting the value of said multiplier factor;

(b) detecting bits having the value of 1 in said multiplier factor;

(c) generating information on a partial product calculating circuit for calculating the partial products of said multiplier factor and multiplicand only with respect to the bits having the value of 1 in said multiplier factor, depending on the result of detection obtained in said step (b);

(d) generating information on a partial product sum calculating circuit for calculating the sum of the partial products calculated by said partial product calculating circuit; and (e) dividing the bits having the value of 1 into groups so that each group contains about the same number of bits having the value of 1 if the number of the bits having the value of 1 is more than a specified integer C (C>0), wherein information on the partial product sum calculating circuit for adding the partial products which correspond to the individual groups is generated in said step (d).

2. A method of automatically generating a logic circuit according to claim 1, wherein said specified integer C is 4 (C=4).

3. A method of automatically generating a logic circuit according to claim 2, wherein said steps (e) and (d) are recursively executed with respect to each of the groups formed in said step (e) if the number of the bits having the value of 1 included in each group is more than a specified integer C (C>0).

4. A method of automatically designing a logic circuit according to claim 1, further comprising the step of (f) generating information on a logic NOT generating circuit for providing the logic NOT number of said multiplier factor, which is obtained by inverting all the bits in said multiplier factor, if the number of the bits having the value of 1 in said multiplier factor is about ½ or more of the number of all the bits in said multiplier factor, the process being performed in said steps (b) to (d) by using said logic NOT number as the multiplier factor, said method of automatically designing a logic circuit further comprising the steps of (g) generating information on a product correcting circuit for calculating the product of the original multiplier factor and said multiplicand, based on the product of said logic NOT number and said multiplicand.

5. A method of automatically designing a logic circuit according to claim 4, wherein said product correcting circuit in said step (g) is for subtracting said multiplicand and the product of said logic NOT number and multiplicand from the product of said multiplicand and a value obtained by raising 2 to the power of the bit width of said original multiplier factor.

6. An apparatus for automatically designing a logic circuit for generating information on the logic circuit for calculating the product of a multiplier factor, which is a constant, and a multiplicand, comprising:

an input means for inputting the value of said multiplier factor;

a detecting means for detecting the bits having the value of 1 in said multiplier factor;

a first circuit information generating means for generating information on a partial product calculating circuit for calculating the partial products of said multiplier factor and multiplicand only with respect to the bits having the value of 1 in said multiplier factor, depending on the result of detection by said detecting means; and a second circuit information generating means for generating information on a partial product sum calculating means for calculating the sum of the partial products calculated by said partial product calculating circuit;

a bit number detecting means for detecting the number of the bits having the value of 1 in said multiplier factor; and a grouping means for dividing the bits having the value of 1 into groups so that each group contains about the same number of bits having the value of 1 if the number of said bits detected by said bit number detecting means is more than a specified integer C (C>0), wherein said second circuit information generating means generates information on the partial product sum calculating circuit for adding the partial products which correspond to the individual groups.

7. An apparatus for automatically calculating a logic circuit according to claim 6, wherein said specified integer C is 4 (C=4).

8. An apparatus for automatically designing a logic circuit according to claim 7, further comprising a recursive process control means which ensures that the process is recursively performed by said bit number detecting means, grouping means, and second circuit information generating means with respect to each of the groups formed by said grouping means.

9. An apparatus for automatically designing a logic circuit according to claim 6, further comprising:

a third circuit information generating means for generating information on a logic NOT generating circuit for providing the logic NOT number of said multiplier factor, which is obtained by inverting all the bits in said multiplier factor by the logic NOT operation, if the number of the bits having the value of 1 in said multiplier factor is about ½ or more of the number of all the bits in said multiplier factor, said detecting means, first circuit information generating means, and second circuit information generating means performing the process by using said logic NOT number as the multiplier factor, said apparatus for automatically designing a logic circuit further comprising a fourth circuit information generating means for generating information on a product correcting circuit for calculating the product of the original multiplier factor and said multiplicand, based on the product of said logic NOT number and said multiplicand.

10. An apparatus for automatically designing a logic circuit according to claim 9, wherein said product correcting circuit in said fourth circuit information generating means is for subtracting said multiplicand and the product of said logic NOT number and multiplicand from the product of said multiplicand and a value obtained by raising 2 to the power of the bit width of said original multiplier factor.

* * * * *

UNITED STATES PATENT AND TRADEMARK OFFICE
CERTIFICATE OF CORRECTION

PATENT NO. : 5,530,664
DATED : June 25, 1996
INVENTOR(S) : Shintaro Tsubata et al.

It is certified that error appears in the above-identified patent and that said Letters Patent is hereby corrected as shown below:

Sheet 8 of 28, FIGURE 8: denoted at reference number 1009, "MULTIPLIER FACTOR = EXPONENT OF 2?" should read --MULTIPLIER FACTOR = POWER-OF 2 NUMBER?--.

Column 1, Line 51, TABLE 1, first column title: "$y_{2i+}2$" should read --$y_{2i+2}$--.

Column 6, Line 12: "A(K-1)-0;" should read --A(K-1)=0;--.

Column 11, Line 65: "condition" should read --conclusion--.

Column 12, Line 9: "condition" should read --conclusion--.

Column 12, Line 13: "condition" should read --conclusion--.

Column 18, Line 41: "means" should read --means 232--.

Column 19, Line 65: "P(n+m-2:0)-P3(n+m-2:0)" should read --P(n+m-2:0)=P3(n+m-2:0)--.

Column 22, Line 57: "(c))." should read --10(c)).--.

Column 26, Line 44: " 1 " should read -- $\ell$ --.

UNITED STATES PATENT AND TRADEMARK OFFICE
CERTIFICATE OF CORRECTION

PATENT NO.  : 5,530,664
DATED       : June 25, 1996
INVENTOR(S) : Shintaro Tsubata et al.

It is certified that error appears in the above-identified patent and that said Letters Patent is hereby corrected as shown below:

Column 26, Line 45:  " 1 " should read -- $\ell$ --.

Column 26, Line 47:  " 1 " should read -- $\ell$ --.

Signed and Sealed this

Fifteenth Day of December, 1998

*Attest:*

BRUCE LEHMAN

*Attesting Officer*     Commissioner of Patents and Trademarks